(12) United States Patent
Wang

(10) Patent No.: US 12,400,699 B2
(45) Date of Patent: Aug. 26, 2025

(54) THREE-DIMENSIONAL NON-VOLATILE MEMORY FLOORPLAN ARCHITECTURE

(71) Applicant: YANGTZE MEMORY TECHNOLOGIES CO., LTD., Wuhan (CN)

(72) Inventor: Ying Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 158 days.

(21) Appl. No.: 18/119,180

(22) Filed: Mar. 8, 2023

(65) Prior Publication Data

US 2024/0221814 A1 Jul. 4, 2024

Related U.S. Application Data

(63) Continuation of application No. PCT/CN2023/076142, filed on Feb. 15, 2023.
(Continued)

(51) Int. Cl.
*G11C 11/406* (2006.01)
*G11C 11/22* (2006.01)

(52) U.S. Cl.
CPC .... *G11C 11/40607* (2013.01); *G11C 11/2255* (2013.01)

(58) Field of Classification Search
CPC . G11C 11/40607; G11C 11/2255; G11C 5/02; G11C 16/0483; G11C 5/025; H10B 43/40
(Continued)

(56) References Cited

U.S. PATENT DOCUMENTS

| 2017/0330624 A1 | 11/2017 | Lim et al. |
| 2018/0197967 A1 | 7/2018 | Oh et al. |

(Continued)

FOREIGN PATENT DOCUMENTS

| CN | 104979002 A | 10/2015 |
| CN | 107393583 A | 11/2017 |

(Continued)

OTHER PUBLICATIONS

International Search Report issued in corresponding International Application No. PCT/CN2023/076142, mailed Sep. 5, 2023, 3 pages.
(Continued)

*Primary Examiner* — Amir Zarabian
(74) *Attorney, Agent, or Firm* — BAYES PLLC

(57) ABSTRACT

A three-dimensional (3D) memory includes a first semiconductor structure having a 3D memory array, wherein the 3D memory array includes a plurality of memory planes, and a second semiconductor structure having a plurality of page buffer circuits, wherein each memory plane has a plurality of bit lines oriented in a bit line direction, a memory-plane-boundary, and a fixed location on the first semiconductor structure, each page buffer circuit has a page-buffer-circuit-boundary, the first semiconductor structure and the second semiconductor structure are bonded to each other in a face-to-face orientation, and a first memory-plane-boundary of a first memory plane, and a first page-buffer-circuit-boundary of a first page buffer circuit, are vertically aligned with each other such that a first portion of the first page-buffer-circuit-boundary is offset from the first memory-plane-boundary in the bit line direction so as to be non-overlapping with an area defined by the first memory-plane-boundary.

20 Claims, 18 Drawing Sheets

Related U.S. Application Data

(60) Provisional application No. 63/436,445, filed on Dec. 30, 2022.

(58) Field of Classification Search
USPC .......................................................... 365/222
See application file for complete search history.

(56) References Cited

U.S. PATENT DOCUMENTS

| | | |
|---|---|---|
| 2019/0365792 A1 | 12/2019 | Risueno et al. |
| 2020/0227398 A1 | 7/2020 | Oh et al. |
| 2020/0411108 A1 | 12/2020 | Lee et al. |
| 2021/0193680 A1 | 6/2021 | Lim et al. |
| 2021/0272631 A1 | 9/2021 | Kim et al. |
| 2021/0366547 A1 | 11/2021 | Oh et al. |
| 2022/0020404 A1 | 1/2022 | Cho et al. |
| 2022/0139895 A1 | 5/2022 | Choi et al. |
| 2023/0267975 A1* | 8/2023 | Kim ........................ H10B 41/27 365/189.05 |

FOREIGN PATENT DOCUMENTS

| | | | |
|---|---|---|---|
| CN | 107658307 | A | 2/2018 |
| CN | 110544497 | A | 12/2019 |
| CN | 110853683 | A | 2/2020 |
| CN | 116634776 | A | 8/2023 |
| EP | 4231802 | A1 | 8/2023 |
| TW | 201209802 | A | 3/2012 |
| TW | 201503151 | A | 1/2015 |
| TW | 201631576 | A | 9/2016 |
| TW | 201714182 | A | 4/2017 |
| TW | 201926352 | A | 7/2019 |
| TW | 202101736 | A | 1/2021 |
| TW | 202109524 | A | 3/2021 |
| TW | 202117722 | A | 5/2021 |
| TW | 202119554 | A | 5/2021 |
| TW | 202119603 | A | 5/2021 |
| TW | 202207375 | A | 2/2022 |
| TW | 202209644 | A | 3/2022 |
| WO | 20222326945 | A1 | 11/2022 |

OTHER PUBLICATIONS

Supplementary European Search Report issued in corresponding European Application No. EP 23908802.4, dated May 27, 2025, 11 pages.

* cited by examiner

THREE-DIMENSIONAL NON-VOLATILE MEMORY FLOORPLAN ARCHITECTURE

CROSS-REFERENCE TO RELATED APPLICATIONS

This application is a continuation of International Application No. PCT/CN2023/076142, filed on Feb. 15, 2023, entitled "THREE-DIMENSIONAL NON-VOLATILE MEMORY FLOORPLAN ARCHITECTURE," the benefit of priority to U.S. Provisional Application No. 63/436,445, filed on Dec. 30, 2022, both of which are incorporated herein by reference in their entireties.

BACKGROUND

The present disclosure relates to the layout and placement of page buffers in three-dimensional (3D) non-volatile memories.

Planar memory cells are scaled to smaller sizes by improving process technology, circuit design, programming algorithms, and fabrication process. However, as feature sizes of the memory cells approach a lower limit, planar process and fabrication techniques become challenging and costly. As a result, memory density for planar memory cells approaches an upper limit.

3D arrangements of memory cells, where memory cells are stacked vertically relative to the substrate, have been developed for use in memory devices. Stacking memory cells vertically provides the desirable outcome of greater bit density in the memory array, but applies primarily to the density of memory arrays.

SUMMARY

According to one aspect of the present disclosure, a three-dimensional (3D) memory, includes a first semiconductor structure having a 3D memory array, wherein the 3D memory array includes a plurality of memory planes, and a second semiconductor structure having a plurality of page buffer circuits, wherein each memory plane has a plurality of bit lines oriented in a bit line direction, a memory-plane-boundary, and a fixed location on the first semiconductor structure, wherein each page buffer circuit has a page-buffer-circuit-boundary, wherein the first semiconductor structure and the second semiconductor structure are bonded to each other in a face-to-face orientation, and wherein a projection of a first page-buffer-circuit-boundary, of a first page buffer circuit, onto the 3D memory array partially overlaps a first portion of an area defined by a first memory-plane-boundary and partially overlaps an area defined by a first portion of a second memory-plane-boundary, wherein the first memory-plane-boundary and the second memory-plane-boundary are adjacent in a first direction. In some implementations the first direction may be the bit line direction.

In some implementations of the 3D memory, a projection of a second page-buffer-circuit-boundary, of a second page buffer circuit, onto the 3D memory array overlaps a second portion of the area defined by the first memory-plane-boundary.

In some implementations of the 3D memory, wherein the projection of the second page-buffer-circuit-boundary onto the 3D memory array is adjacent in the bit line direction to a projection of a pad circuit onto the 3D memory array.

In some implementations of the 3D memory, the first semiconductor structure further includes a pad circuit.

In some implementations the 3D memory further includes a first bonding dielectric layer, having a plurality of electrically conductive first bonding contacts, disposed above the 3D memory array of the first semiconductor structure; and a second bonding dielectric layer, having a plurality of electrically conductive second bonding contacts, disposed above the plurality of page buffer circuits of the second semiconductor structure; wherein a first memory plane on the first semiconductor structure is electrically coupled to a first page buffer circuit on the second semiconductor structure through at least one first bonding contact and at least one second bonding contact.

In some implementations of the 3D memory, the at least one first bonding contact and the at least one second bonding contact each comprise copper.

In some implementations of the 3D memory, a first bit line of a first memory plane of the plurality of memory planes on the first semiconductor structure is electrically coupled to a first page buffer circuit on the second semiconductor structure through at least one first bonding contact and at least one second bonding contact.

In some implementations of the 3D memory, each memory plane comprises floating gate flash memory cells.

In some implementations of the 3D memory, each memory plane comprises charge-trapping flash memory cells.

In some implementations the 3D memory further includes a third page buffer circuit, of the plurality of page buffer circuits, having a third page-buffer-circuit-boundary, and a fourth page buffer circuit, of the plurality of page buffer circuits, having a fourth page-buffer-circuit-boundary, wherein an area defined by the third page-buffer-circuit-boundary is completely overlapped by an area defined by the second memory-plane boundary, an area defined by the fourth page-buffer-circuit-boundary is completely overlapped by the area defined by the second memory-plane-boundary, pad circuitry is disposed under the first memory plane, and pad circuitry is not disposed under the second memory plane.

According to another aspect of the present disclosure, a method of making a 3D memory includes providing a first semiconductor structure having a 3D memory array, wherein the 3D memory array includes a plurality of memory planes wherein each memory plane has a plurality of bit lines disposed in a bit line direction, providing a second semiconductor structure having a plurality of page buffer circuits, and bonding the first semiconductor structure and the second semiconductor structure in a face-to-face orientation, such that at least one page buffer circuit of the plurality of page buffer circuits is vertically aligned with a corresponding memory plane of the plurality of memory planes such that the at least one page buffer circuit projection of the plurality of page buffer circuits crosses, in the bit line direction, a memory-plane-boundary of the corresponding memory plane.

In some implementations, the method of making a 3D memory further includes forming, above the 3D memory array, one or more interconnect layers; and forming, above the one or more interconnect layers, a first bonding dielectric layer having a plurality of electrically conductive first bonding contacts, wherein the one or more interconnect layers provide at least a portion of at least one electrically conductive path between a bit line of the 3D memory array and a first bonding contact of the first bonding dielectric layer.

In some implementations, the method of making a 3D memory further includes forming, above the plurality of page buffer circuits, one or more interconnect layers, and forming a second bonding dielectric layer having a plurality of electrically conductive second bonding contacts disposed above the one or more interconnect layers, wherein the one or more interconnect layers provide at least a portion of at least one electrically conductive path between a first page buffer circuit and a second bonding contact of the second bonding dielectric layer.

In some implementations, the 3D memory array is a non-volatile memory array.

In some implementations, the 3D memory array is a flash memory array.

In some implementations, the method of making a 3D memory further includes placing a first page buffer circuit at a location on the second semiconductor structure such that, subsequent to bonding, the first page buffer circuit is vertically aligned with a first memory plane such that a first portion of the first page buffer circuit is non-overlapping with the first memory plane in a bit line direction.

According to a further aspect of the present disclosure, a memory system, includes a printed circuit board having an edge connector, a non-volatile memory controller device disposed on the printed circuit board, a plurality of non-volatile memory devices disposed on the printed circuit board, and coupled to the non-volatile memory controller device, wherein at least one of the non-volatile memory devices includes a first semiconductor structure having a 3D memory array, wherein the 3D memory array includes a plurality of memory planes, a second semiconductor structure having a plurality of page buffer circuits, and wherein each memory plane has a plurality of bit lines oriented in a bit line direction, and has a memory-plane-boundary, wherein each page buffer circuit has a page-buffer-circuit-boundary, wherein the first semiconductor structure and the second semiconductor structure are bonded to each other in a face-to-face orientation, and wherein a first memory-plane-boundary and a first page-buffer-circuit-boundary are vertically aligned with each other such that the first page-buffer-circuit-boundary is offset from the first memory-plane-boundary in the bit line direction, and such that a first portion of the first page-buffer-circuit-boundary is non-overlapping with an area defined by the first memory-plane-boundary.

In some implementations, a second portion of the first page-buffer-circuit-boundary overlaps with a portion of the area defined by the first memory-plane-boundary.

In some implementations, at least one of the non-volatile memory devices further includes a first bonding dielectric layer, having a plurality of electrically conductive first bonding contacts, and a second bonding dielectric layer, having a plurality of electrically conductive second bonding contacts.

In some implementations, an electrically conductive path between at least one bit line and at least one page buffer circuit includes a first one of the first bonding contacts and a first one of the second bonding contacts.

These illustrative implementations are mentioned not to limit or define the present disclosure, but to provide examples to aid understanding thereof. Additional implementations are discussed in the Detailed Description, and further description is provided there.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use implementations of the present disclosure.

Figure 1A:
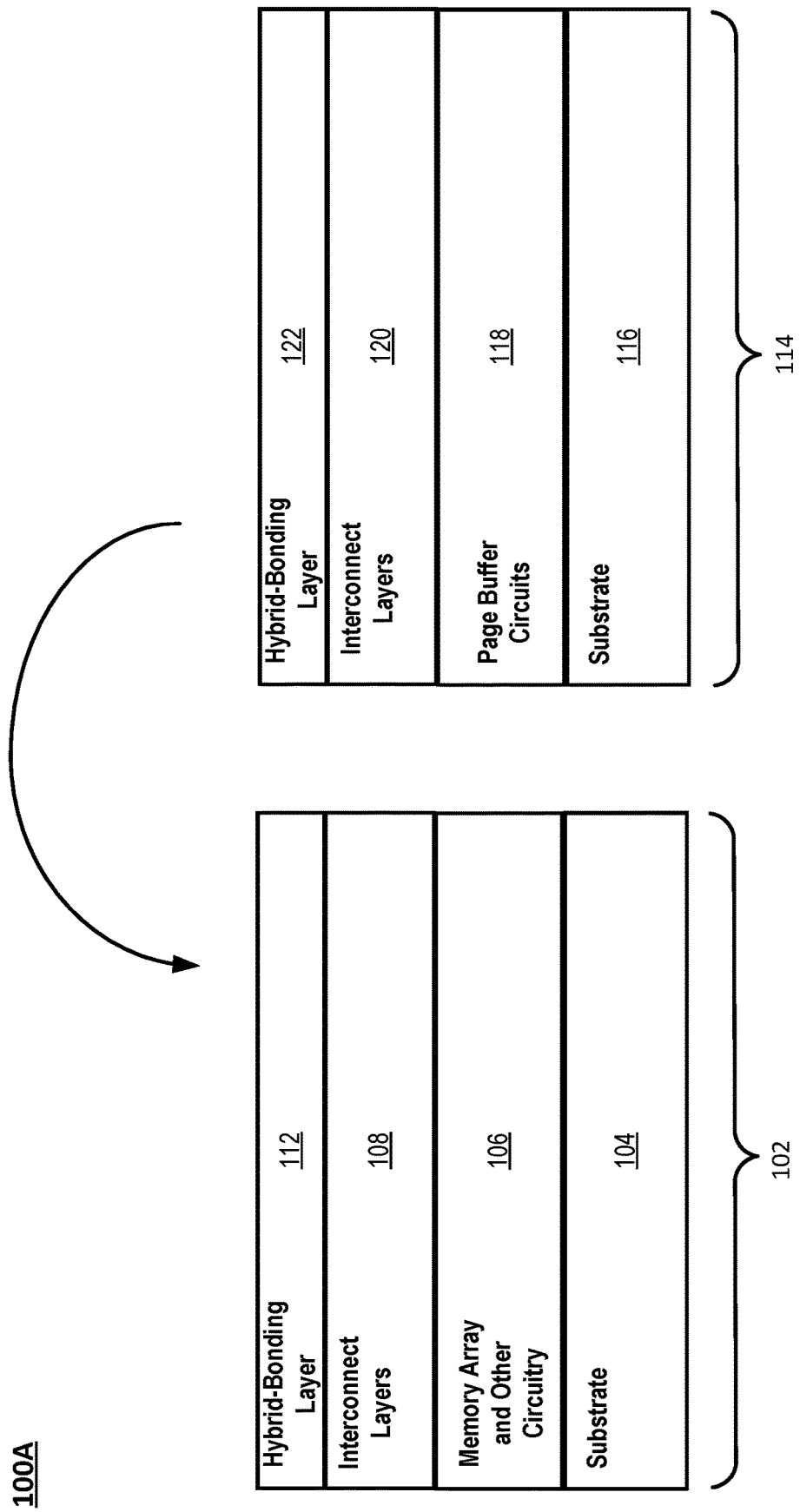
FIG. 1A is a block diagram illustrating a first semiconductor structure and a second semiconductor structure prior to being bonded together to form a 3D memory device.

The present disclosure will be described with reference to the accompanying drawings.

DETAILED DESCRIPTION

Various illustrative examples and implementations are presented herein to facilitate the understanding of the structures of, and methods for producing, a floorplan architecture for 3D non-volatile memories in accordance with the present disclosure.

It is noted that references in the specification to "one implementation," "an implementation," "an example implementation," "some implementation," etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to effect such feature, structure or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with memory cells that can be arranged vertically on a laterally-oriented substrate so that the number of memory cells can be scaled up in the vertical direction with respect to the substrate. As used herein, the term "vertical/vertically" means nominally perpendicular to the lateral surface of the laterally-oriented substrate.

As used herein, the acronym "CMOS" refers to Complementary Metal Oxide Semiconductor. "CMOS process" refers to a semiconductor manufacturing process that produces both n-channel field effect transistors and p-channel field effect transistors on the same substrate. "CMOS circuit" refers to an electrical circuit that includes both an n-channel field effect transistor and a p-channel field effect transistor.

FIG. 1A is a block diagram illustrating a pair of semiconductor structures 100A, including a first semiconductor structure 102 and a second semiconductor structure 114 prior to being bonded together to form a 3D memory device. First semiconductor structure 102 may be a die, and second semiconductor structure 114 may be a die. First semiconductor structure 102 includes a substrate 104, a memory array 106, interconnect layers 108 disposed above memory array 106, and a hybrid-bonding layer 112 disposed above interconnect layers 108. In some implementations, substrate 104 may be, but is not limited to, a silicon substrate, and memory array 106 may be, but is not limited to, a NAND flash memory array. In some implementations, memory array 106 may be a 3D NAND flash memory array having a plurality of NAND strings that are vertically-oriented relative to substrate 104, and each of the vertically-oriented NAND strings may include a plurality of non-volatile memory cells. The non-volatile memory cells, may be, but are not limited to, charge-trapping memory cells or floating gate memory cells. Interconnect layer 108 may include multiple levels of interconnect lines, with each level electrically connected to a vertically adjacent level by one or more vias. Hybrid-bonding layer 112 may be a dielectric layer having a plurality of first bonding contacts disposed therein. Second semiconductor structure 114 includes a substrate 116, page buffer circuits 118, interconnect layers 120 disposed above page buffer circuits 118, and a hybrid-bonding layer 122 disposed above interconnect layers 120. In some implementations, page buffer circuits 118 are CMOS circuits. Interconnect layer 120 may include multiple levels of interconnect lines, with each level electrically connected to a vertically adjacent level by one or more vias. Hybrid-bonding layer 122 may be a dielectric layer having a plurality of second bonding contacts disposed therein. First semiconductor structure 102 and second semiconductor structure 114 are configured to be bonded together in a face-to-face orientation such that hybrid-bonding layer 122 and hybrid-bonding layer 112 are bonded to each other.

Figure 1B:
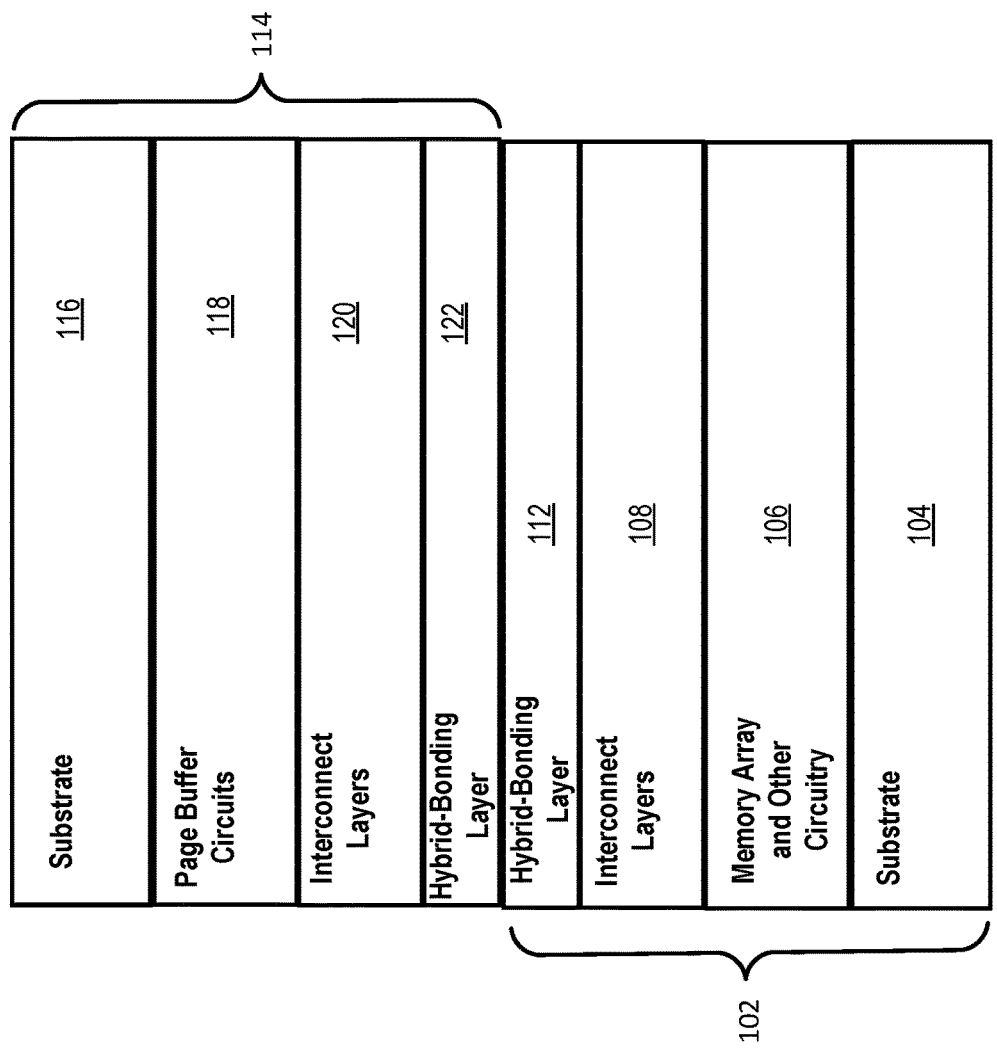
FIG. 1B is a block diagram illustrating the first semiconductor structure and the second semiconductor structure after being bonded together in a face-to-face orientation to form a 3D memory device.

FIG. 1B is a block diagram showing first semiconductor structure 102 and second semiconductor structure 114 after being bonded together in a face-to-face orientation to form a 3D memory device 100B. In this bonded configuration, one or more first bonding contacts of hybrid-bonding layer 112 are in electrical contact with a corresponding one or more second bonding contacts or hybrid-bonding layer 122. It will be appreciated that the orientation of 3D memory device 100B, shown in FIG. 1B with first semiconductor structure 102 on the bottom and second semiconductor structure 114 on top is illustrative and not limiting. That is, 3D memory device 100B, may be oriented such that second semiconductor structure 114 is on the bottom with its hybrid bonding layer 122 as its top layer, and first semiconductor structure 102 is on top with its hybrid bonding layer 112 as its bottom layer. In this alternative orientation, memory array 106 is in the top portion of 3D memory device 100B. In various manufacturing processes after first semiconductor structure 102 and second semiconductor structure 114 are bonded together, a substrate may be partially or completely removed from at least one of the semiconductor structures and a new semiconductor layer formed thereon. Additional details of the first and second bonding contacts are described below in connection with FIGS. 1C and 1D.

Figure 1C:
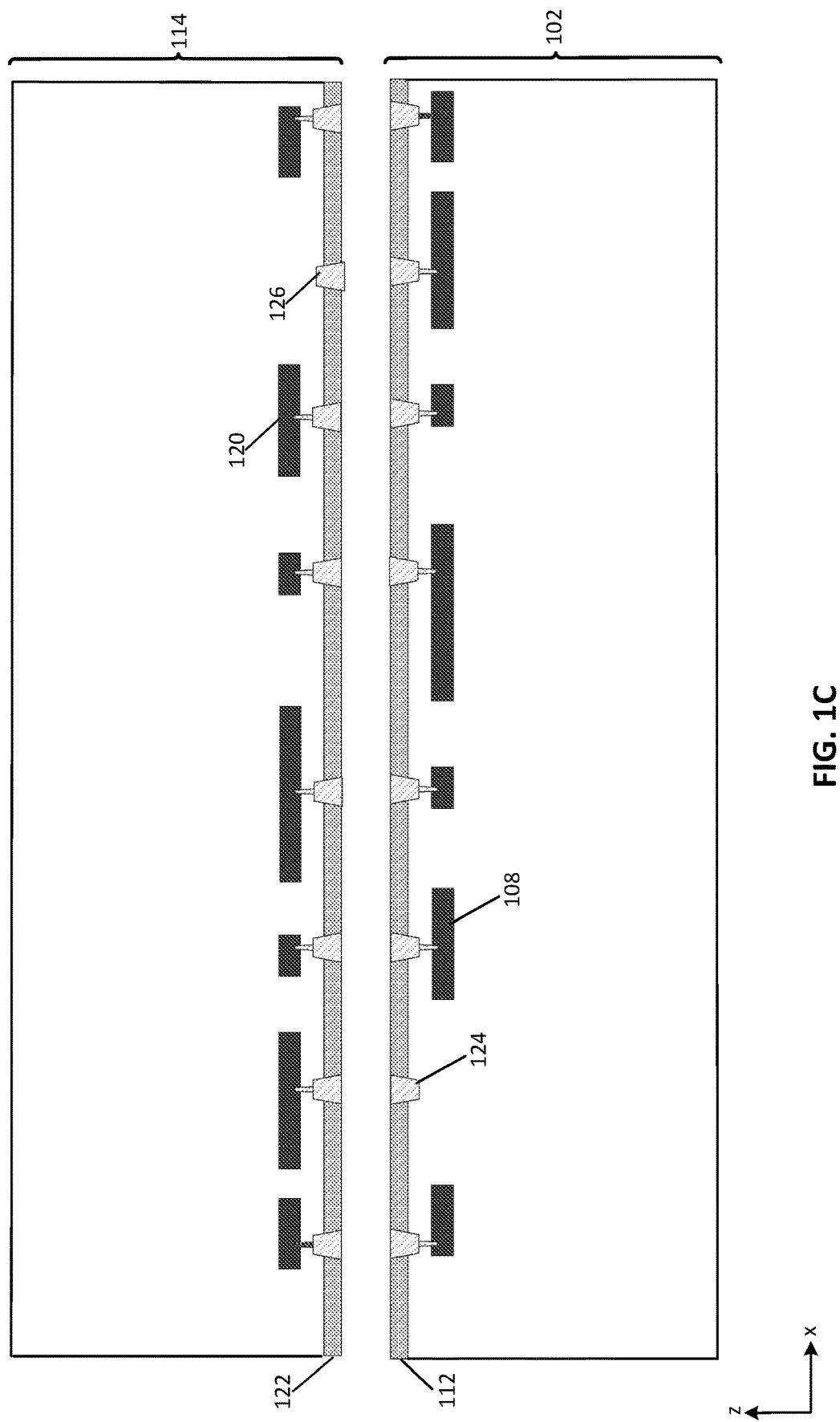
FIG. 1C illustrates a bonding layer of the first semiconductor structure, and a bonding layer of the second semiconductor structure, aligned for, but prior to, bonding in a face-to-face orientation to form a 3D memory device.

FIG. 1C illustrates first semiconductor structure 102 with a more detailed representation of hybrid-bonding layer 112, and second semiconductor structure 114 with a more detailed representation of hybrid-bonding layer 122, aligned for, but prior to, bonding in a face-to-face orientation to form a 3D memory device. As shown in FIG. 1C, hybrid-bonding layer 112 of first semiconductor structure 102 includes a plurality of first bonding contacts 124 disposed therein. Interconnect lines from interconnect layer 108 are also illustrated. In this illustrative implementation, one or more first bonding contacts may be in electrical contact with an interconnect line of interconnect layer 108. Interconnect lines from interconnect layer 108 provide electrical pathways from at least memory array 106 of first semiconductor structure 102 to one or more first bonding contacts 124.

Still referring to FIG. 1C, hybrid-bonding layer 122 of second semiconductor structure 114 includes a plurality of second bonding contacts 126 disposed therein. Second semiconductor structure 114 further includes interconnect lines from interconnect layer 120. In this illustrative implementation, one or more second bonding contacts may be in electrical contact with an interconnect line of interconnect layer 120. Interconnect lines from interconnect layer 120 provide electrical pathways from at least page buffer circuits 118 of second semiconductor structure 114 to one or more second bonding contacts 126.

Figure 1D:
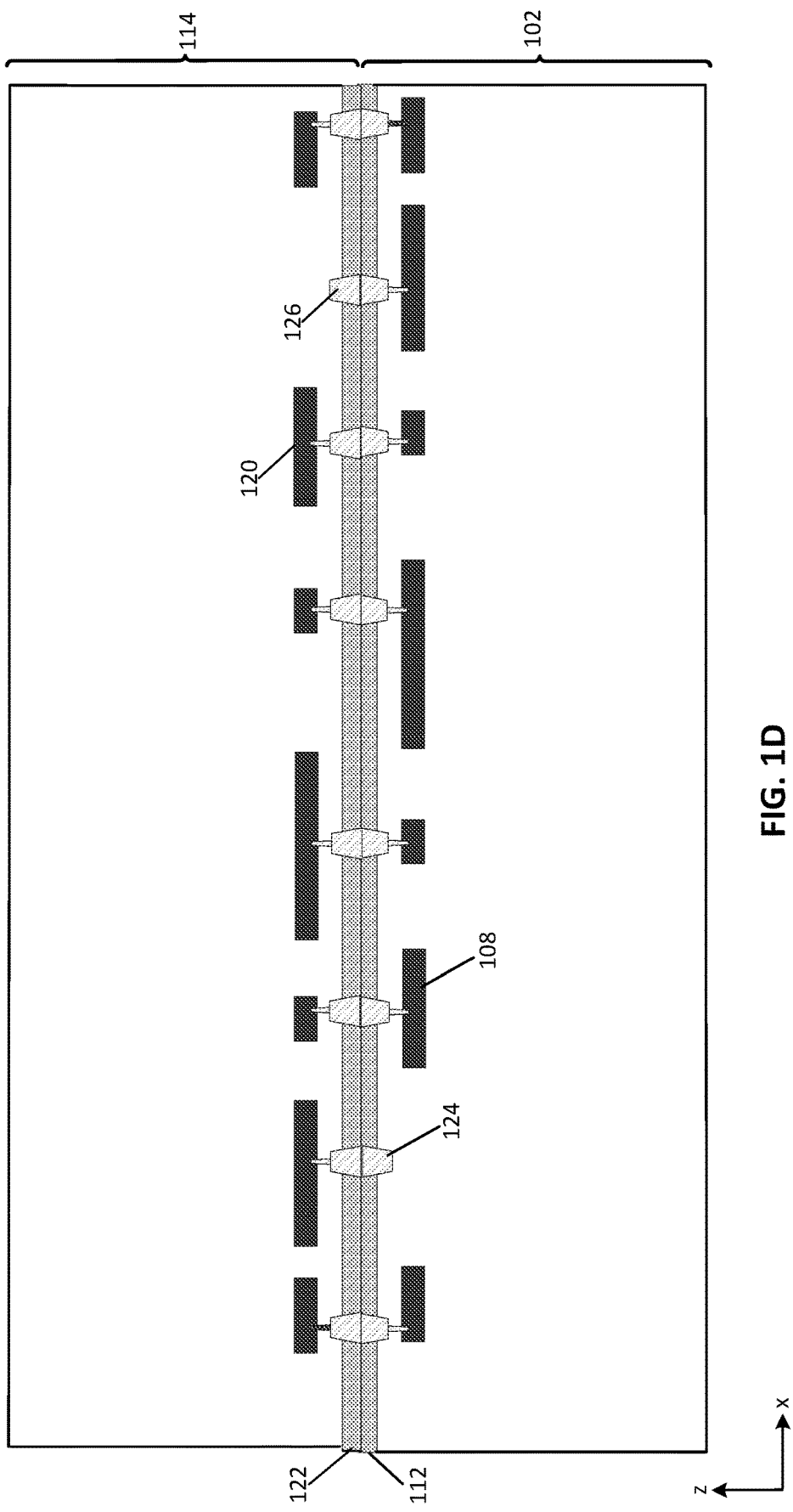
FIG. 1D illustrates the bonding layer of the first semiconductor structure, and the bonding layer of the second semiconductor structure, after bonding in a face-to-face orientation to form a 3D memory device.

FIG. 1D is similar to FIG. 1C but illustrates hybrid-bonding layer 112 of first semiconductor structure 102, and hybrid-bonding layer 122 of second semiconductor structure 114, after bonding in a face-to-face orientation to form a 3D memory device. In this way, first bonding contacts 124 may be in electrical contact with the corresponding ones of second bonding contacts 126. The electrical connections between first bonding contacts 124 and second bonding contacts 126 allow electrical signals to pass between first semiconductor structure 102 and second semiconductor structure 114.

Figure 1E:
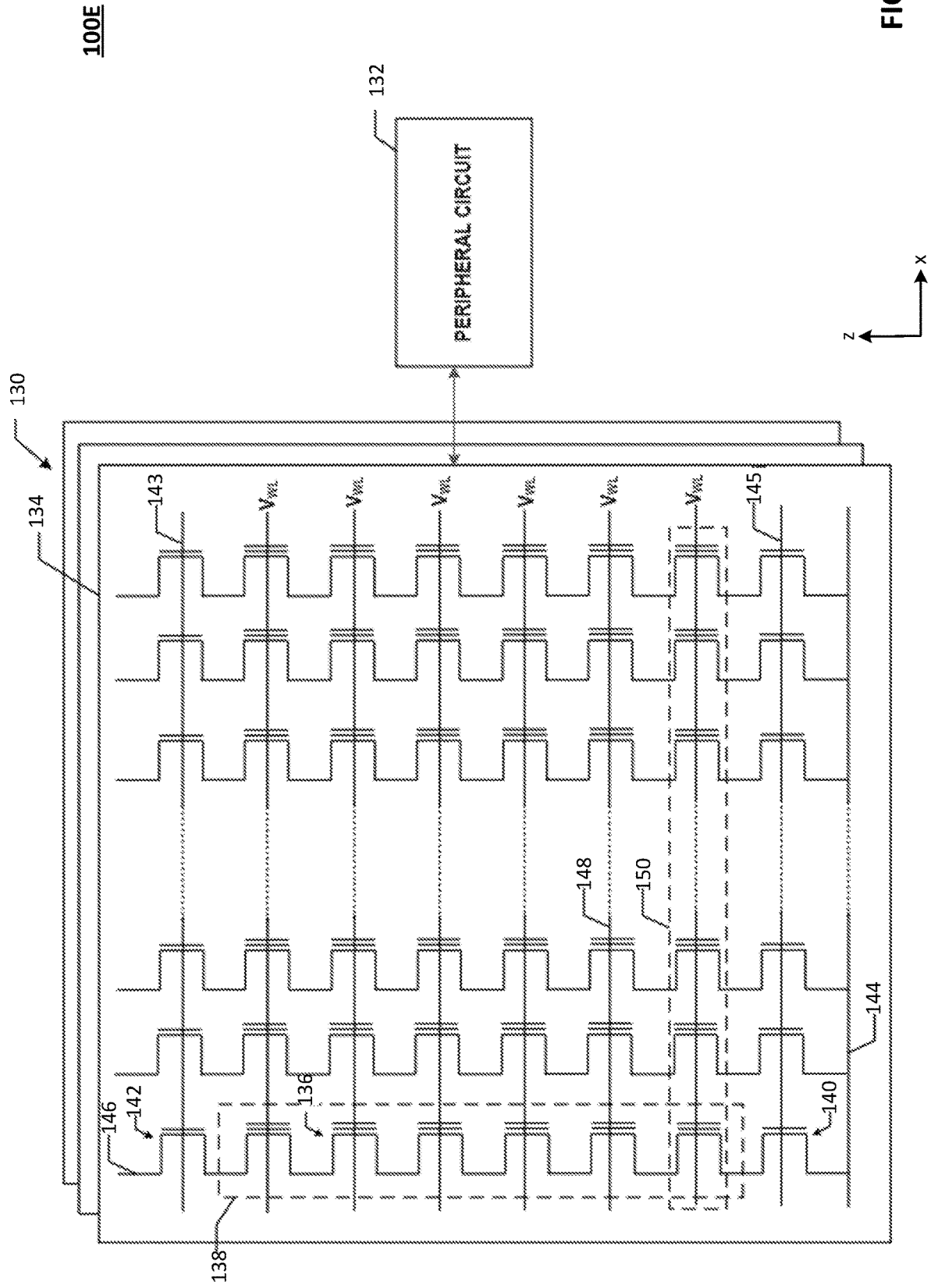
FIG. 1E is a schematic diagram illustrating a portion of an illustrative memory cell array of a NAND architecture non-volatile memory device.

FIG. 1E is a schematic diagram illustrating a portion of an illustrative memory cell array and peripheral circuits of a NAND architecture non-volatile memory device 100E. Memory device 100E may include a memory cell array 130 and peripheral circuits 132 coupled to memory cell array 130. Memory cell array 130 may be a NAND Flash memory cell array in which memory cells 136 are provided in the form of an array of NAND memory strings 138 each extending vertically above a substrate. In some implementations, each NAND memory string 138 includes a plurality of memory cells 136 coupled in series and stacked vertically. As shown in FIG. 1E, NAND memory string 138 is coupled to a bit line 146 by a bit line select transistor 142. The gate terminal of bit line select transistor 142 is coupled to a bit line select signal 143. NAND memory string 138 is coupled to a common source line 144 by a source select transistor 140. The gate terminal of source select transistor 140 is coupled to a source select signal 145.

NAND memory strings 138 can be organized into multiple blocks 134, each of which can have a common source line 144. In some implementations, each block 134 is the basic data unit for erase operations, i.e., all memory cells 136 on the same block 134 are erased at the same time. To erase memory cells 136 in a selected block 134, source lines 144 coupled to selected block 134 as well as unselected blocks 134 in the same plane as selected block 134 may be biased with an erase voltage (Vers), such as a high positive bias voltage (e.g., 20 V or more). Memory cells 136 of adjacent NAND memory strings 138 may be coupled through word lines 148 that select which row of memory cells 136 is affected by read and program operations. In some implementations, each word line 148 is coupled to a page 150 of memory cells 136, which is the basic data unit for read and program operations. The size of one page 150 in bits can relate to the number of NAND memory strings 138 coupled by word line 148 in one block 134.

Still referring to FIG. 1E, memory cell array 130 may include an array of memory cells 136 in a plurality of rows and a plurality of columns in each block 134. One row of memory cells 136 corresponds to one or more pages 150, and one column of memory cells corresponds to one NAND memory string 138, according to some implementations. The plurality of rows of memory cells 136 may be respectively coupled to word lines 148, and the plurality of columns of memory cells 136 may be respectively coupled to bit lines 146. Peripheral circuit 132 may be coupled to memory cell array 130 through bit lines 146 and word lines 148.

Figure 1F:
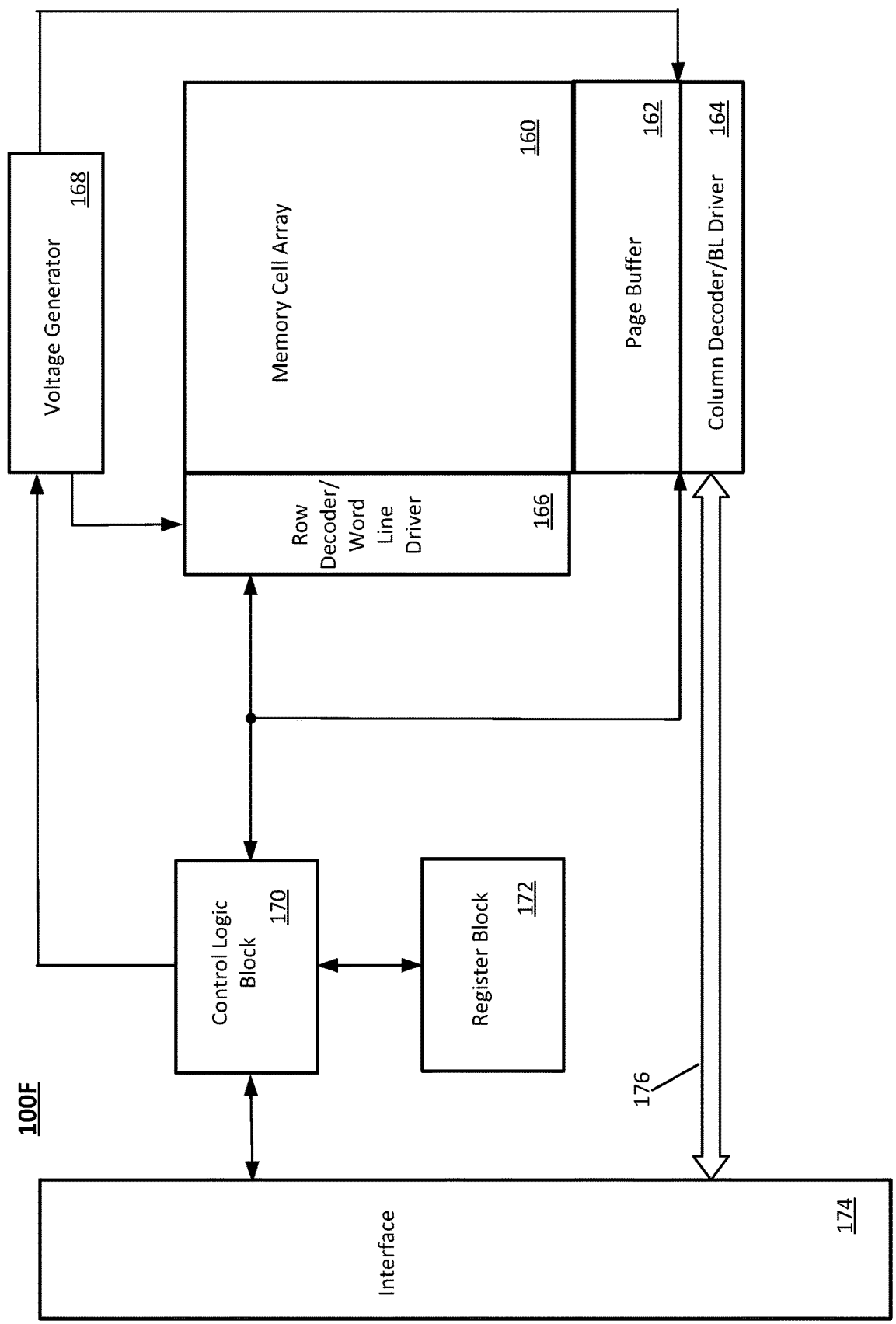
FIG. 1F is a block diagram of an illustrative 3D memory device.

FIG. 1F is a block diagram of an illustrative 3D memory device 100F, and shows a memory cell array 160, a page buffer 162, a column decoder/bit line driver 164, a row decoder/word line driver 166, a voltage generator 168, a control logic block 170, a register block 172, an interface 174, and a data bus 176.

Page buffer 162 may be configured to read and program (write) data from and to memory cell array 160 according to the control signals from control logic block 170. In one example, page buffer 162 may store one or more pages of program data (write data) to be programmed into a target row of memory cell array 160. In another example, page buffer 162 may verify programmed target memory cells of memory cell array 130 in each program/verify loop (cycle) in a program operation to ensure that the data has been properly programmed into the targeted memory cells of memory cell array 160. In still another example, page buffer 162 may also sense the low power signals from a bit line that represents a data bit stored in a memory cell of memory cell array 160 and amplify the small voltage swing to a recognizable logic level in a read operation.

In program operations, page buffer 162 may include storage modules (e.g., latches) for temporarily storing a piece of N-bits data (e.g., in the form of gray codes) received from data bus 176 and providing the piece of N-bits data to a corresponding target memory cell of memory cell array 160 through a corresponding bit line. In a read operation, page buffer 162 may be configured to read one or more (M) bits of the piece of N-bits data.

Column decoder/bit line driver 164 can be configured to be controlled by control logic block 170 and select one or more NAND memory strings 138 by applying bit line voltages generated from voltage generator 168. Row decoder/word line driver 166 may be configured to be controlled by control logic block 170 and select/deselect blocks 134 of memory cell array 130 and select/deselect word lines 148 of block 134. Row decoder/word line driver 166 may be further configured to drive word lines 148 using word line voltages generated from voltage generator 168.

As part of peripheral circuits 132, control logic block 170 may be coupled to other peripheral circuits and configured to control the operations of the other peripheral circuits. Register block 172 may be coupled to control logic block 170 and include status registers, command registers, and address registers for storing status information, command operation codes, and command addresses for controlling the operations of each peripheral circuit. Interface 174 may be coupled to control logic block 170 and act as a control buffer to buffer and relay control commands received from a host to control logic block 170 and status information received from control logic block 170 to the host. Interface 174 may also be coupled to column decoder/bit line driver 164 via data bus 176 and act as a data input/output (I/O) interface and a data buffer to buffer and relay the data to and from memory cell array 160.

Figure 2:
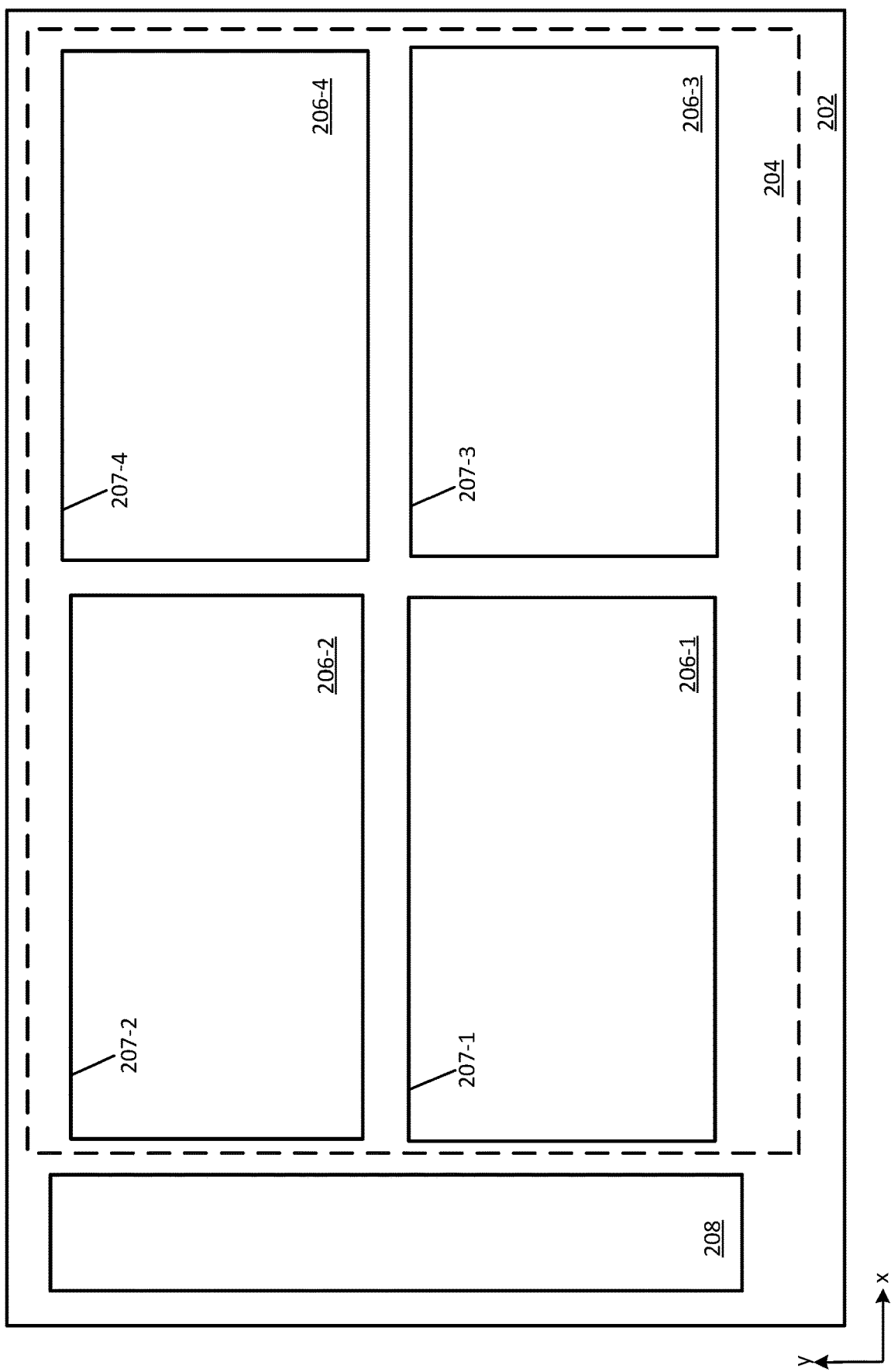
FIG. 2 is a high-level block diagram of a semiconductor structure having a 3D memory array disposed thereon, prior to being bonded in a face-to-face orientation to another semiconductor structure that has page buffer circuits thereon, wherein the 3D memory array includes a plurality memory planes in a general arrangement.

FIG. 2 is a high-level block diagram of an illustrative semiconductor structure 202 having a 3D memory array 204 disposed thereon, prior to being bonded in a face-to-face orientation to another semiconductor structure that has page buffer circuits thereon. In this illustrative implementation, 3D memory array 204 includes four memory planes 206-1, 206-2, 206-3, and 206-4 shown in a general arrangement wherein the memory planes are non-abutting. In this illustrative implementation, memory planes 206-1, 206-2, 206-3, and 206-4 are each 3D NAND flash memory planes having a plurality of NAND strings that are vertically-oriented, and each of the vertically-oriented NAND strings may include a plurality of non-volatile memory cells. The non-volatile memory cells of memory planes 206-1, 206-2, 206-3, and 206-4, may be, but are not limited to, charge-trapping memory cells or floating gate memory cells. In this illustrative implementation, each memory plane 206-1, 206-2, 206-3, and 206-4 has a corresponding memory-plane-boundary 207-1, 207-2, 207-3, and 207-4, as shown in FIG. 2. The NAND strings of memory plane 206-1 are disposed in an area defined by memory-plane-boundary 207-1. The NAND strings of memory plane 206-2 are disposed in an area defined by memory-plane-boundary 207-2. The NAND strings of memory plane 206-3 are disposed in an area defined by memory-plane-boundary 207-3. The NAND strings of memory plane 206-4 are disposed in an area defined by memory-plane-boundary 207-4.

Still referring to FIG. 2, circuit block 208 represents additional circuitry that may be included on semiconductor structure 202 outside of 3D memory array 204. The additional circuitry of circuit block 208 may include, but is not limited to, interface logic, control logic, voltage generators, and so on. It will be understood that, for the sake of clarity, FIG. 2 does not show interconnect layers 108 disposed above 3D memory array 204 and circuit block 208; and does not show hybrid-bonding layer 112 disposed above interconnect layers 108.

Figure 3:
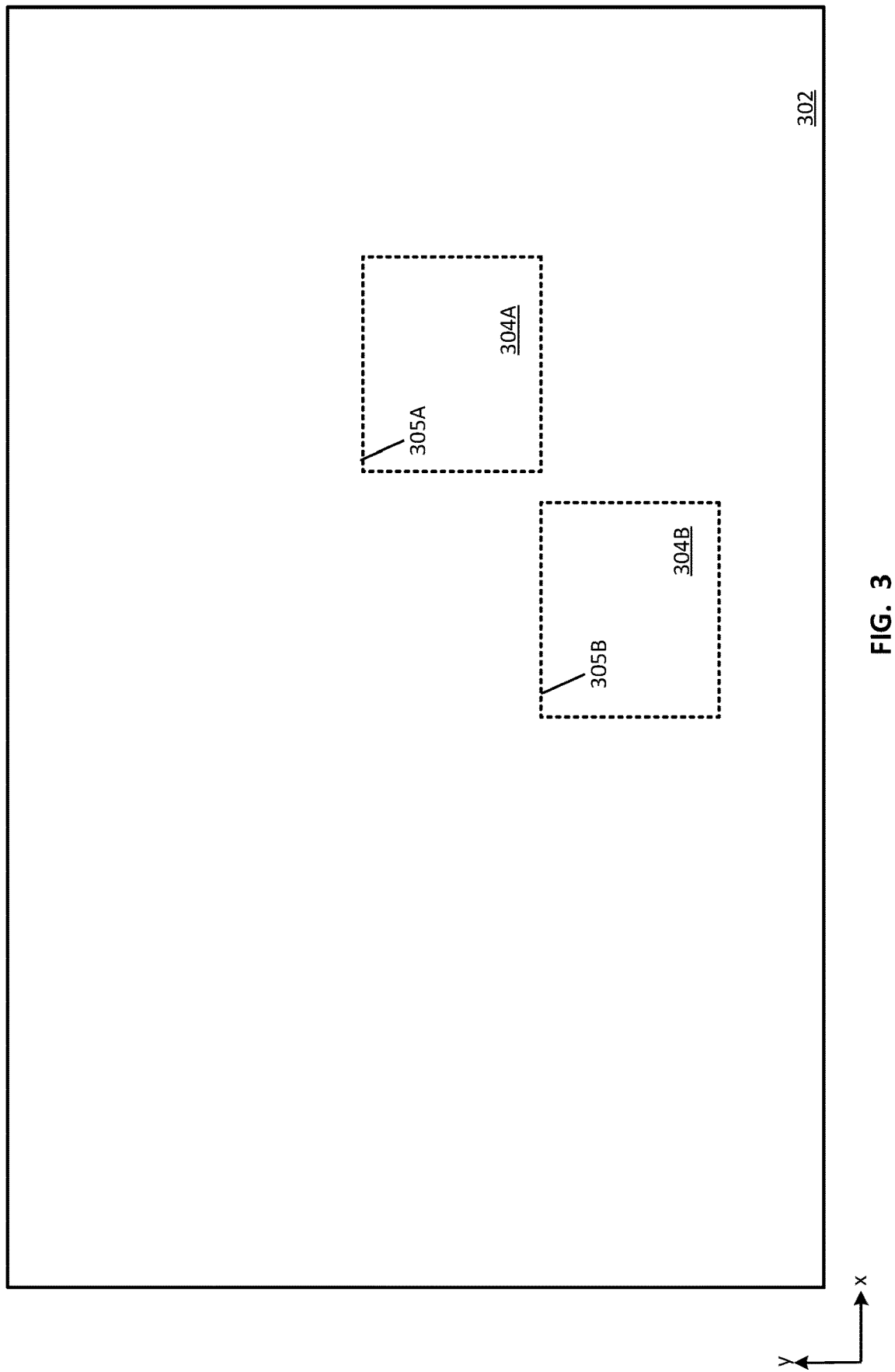
FIG. 3 is a high-level block diagram showing the placement of page buffer circuits on a semiconductor structure prior to being bonded in a face-to-face orientation to another semiconductor structure that has a 3D memory array disposed thereon.

FIG. 3 is a high-level block diagram showing the placement of page buffer circuits on an illustrative semiconductor structure 302 prior to being bonded in a face-to-face orientation to semiconductor structure 202 (see FIG. 2). Semiconductor structure 302 has a first page buffer circuit 304A and a second page buffer circuit 304B disposed thereon. First page buffer circuit 304A has a first page-buffer-circuit-boundary 305A, and second page buffer circuit 304B has a second page-buffer-circuit-boundary 305B. The circuitry of first page buffer circuit 304A is disposed within an area defined by first page-buffer-circuit-boundary 305A. The circuitry of second page buffer circuit 304B is disposed within an area defined by second page-buffer-circuit-boundary 305B. It will be understood that, for the sake of clarity, FIG. 3 does not show interconnect layers 120 disposed above first page buffer circuit 304A and second page buffer circuit 304B, and does not show hybrid-bonding layer 122 disposed above interconnect layers 120.

FIGS. 4A-4G show various arrangements of memory planes, page buffer circuits, and pad circuits relative to each other, and illustrate the advantages of the cross-plane page buffer circuit layout arrangement of the 3D non-volatile memory floorplan architecture disclosed herein.

Figure 4A:
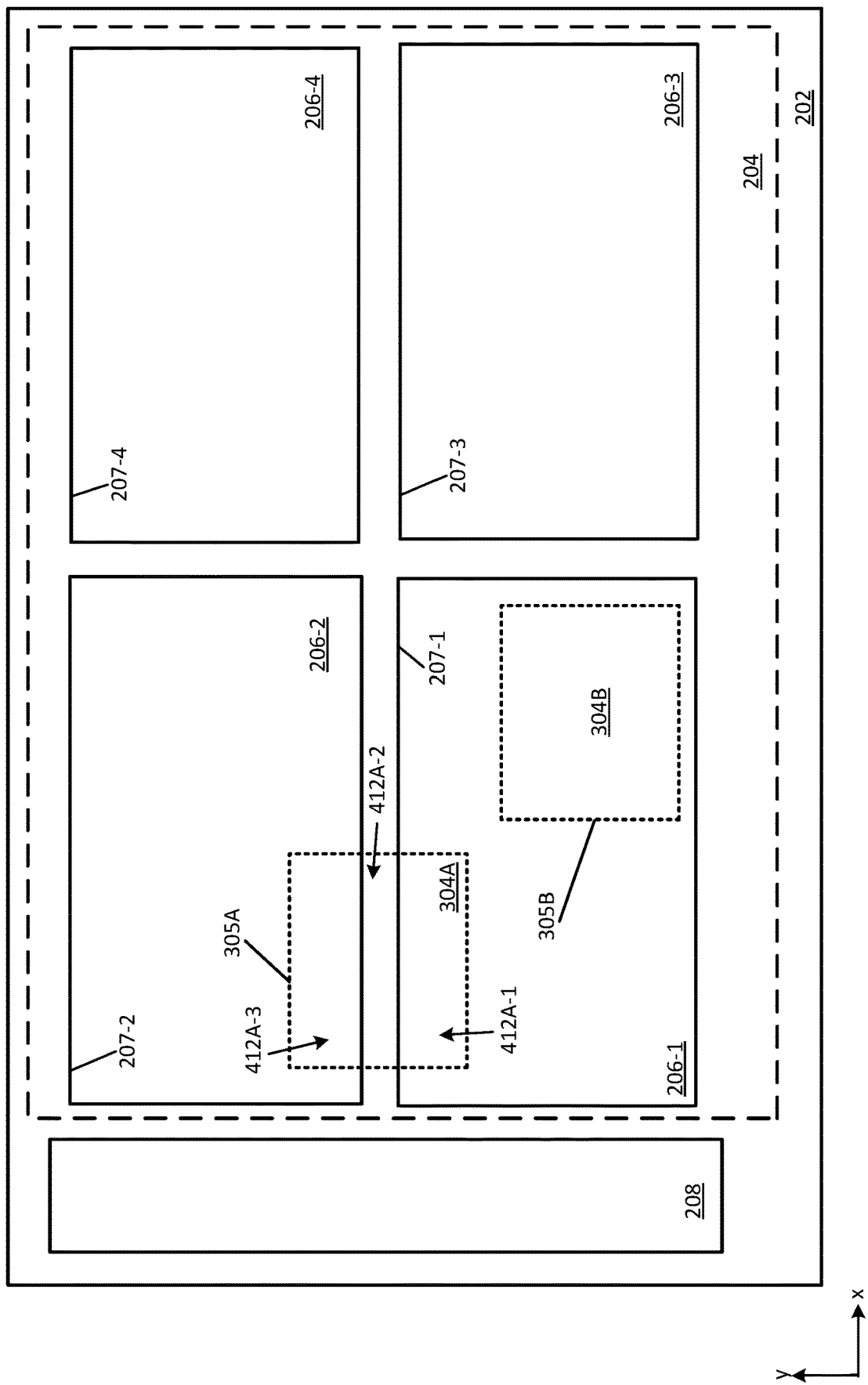
FIG. 4A is a high-level block diagram illustrating the position of the page buffer circuits of one semiconductor structure relative to a memory plane of another semiconductor structure after the two semiconductor structures have been bonded to each other in a face-to-face orientation, wherein a plurality of memory planes are shown in a general arrangement.

FIG. 4A is a high-level block diagram illustrating the positions of page buffer circuit 304A and page buffer circuit 304B relative to their respective vertical alignments to memory plane 206-1 and memory plane 206-2 after semiconductor structure 202 and semiconductor structure 302 have been bonded to each other in a face-to-face orientation. In this illustrative implementation the memory planes have a general arrangement wherein the memory planes are non-abutting. It will be understood that, for the sake of clarity, FIG. 4A does not show interconnect layers 108, 120; and does not show hybrid-bonding layers 112, 122. In other words, although interconnect layers 108, 120, and hybrid-bonding layers 112, 122 are physically disposed vertically between memory planes 206-1, 206-2 and page buffer circuits 304A, 304B, those intervening are not shown in FIG. 4 for the purpose of clearly explaining the positions of the page buffer circuits relative to the memory planes. FIG. 4A is essentially FIG. 2 with FIG. 3 flipped over and placed on top of it. In this way, FIG. 4A is able to show the positions of page buffer circuits 304A, 304B relative to memory planes 206-1 and 206-2 after semiconductor structures 202, 302 have been bonded to each other in a face-to-face orientation. In this illustrative implementation, two page buffer circuits are shown in FIG. 4A, however, this is not a limitation of the present disclosure, and there may be more or fewer page buffer circuits. In some implementations, there is at least one page buffer circuit for each memory plane in the memory array.

Still referring to the illustrative implementation of FIG. 4A, it can be seen that first page buffer circuit 304A is aligned such that a first portion of first page buffer circuit 304A overlaps a portion of first memory plane 206-1, such that the union of first page buffer circuit 304A and first memory plane 206-1 defines a first area 412A-3. Further, a second portion of first page buffer circuit 304A overlaps a region between first memory plane 206-1 and second memory plane 206-2 such that the union thereof defines a second area 412A-2. Further still, a third portion of page buffer circuit 304A overlaps a portion of second memory plane 206-2 such that the union thereof defines a third area 412A-1. It can be seen in FIG. 4A that first page buffer circuit 304A is shifted in the y-direction relative to first memory plane 206-1. In this illustrative implementation, the y-direction is the bit line direction. In some implementations, first area 412A-1 may be greater than second area 412A-2. In some implementations, first area 412A-1 may be greater than third area 412A-3.

Still referring to the illustrative implementation of FIG. 4A, it can be seen that second page buffer circuit 304B is aligned with 3D memory array 204 such that second page buffer circuit 304B is fully overlapped by first memory plane 206-1.

By placing first page buffer circuit 304A so that it is shifted in the bit line direction such that it partially overlaps adjacent second memory plane 206-2 in the bit line direction, additional routing space is created between the first page buffer circuit and second page buffer circuit. This additional routing space advantageously reduces routing congestion.

Figure 4B:
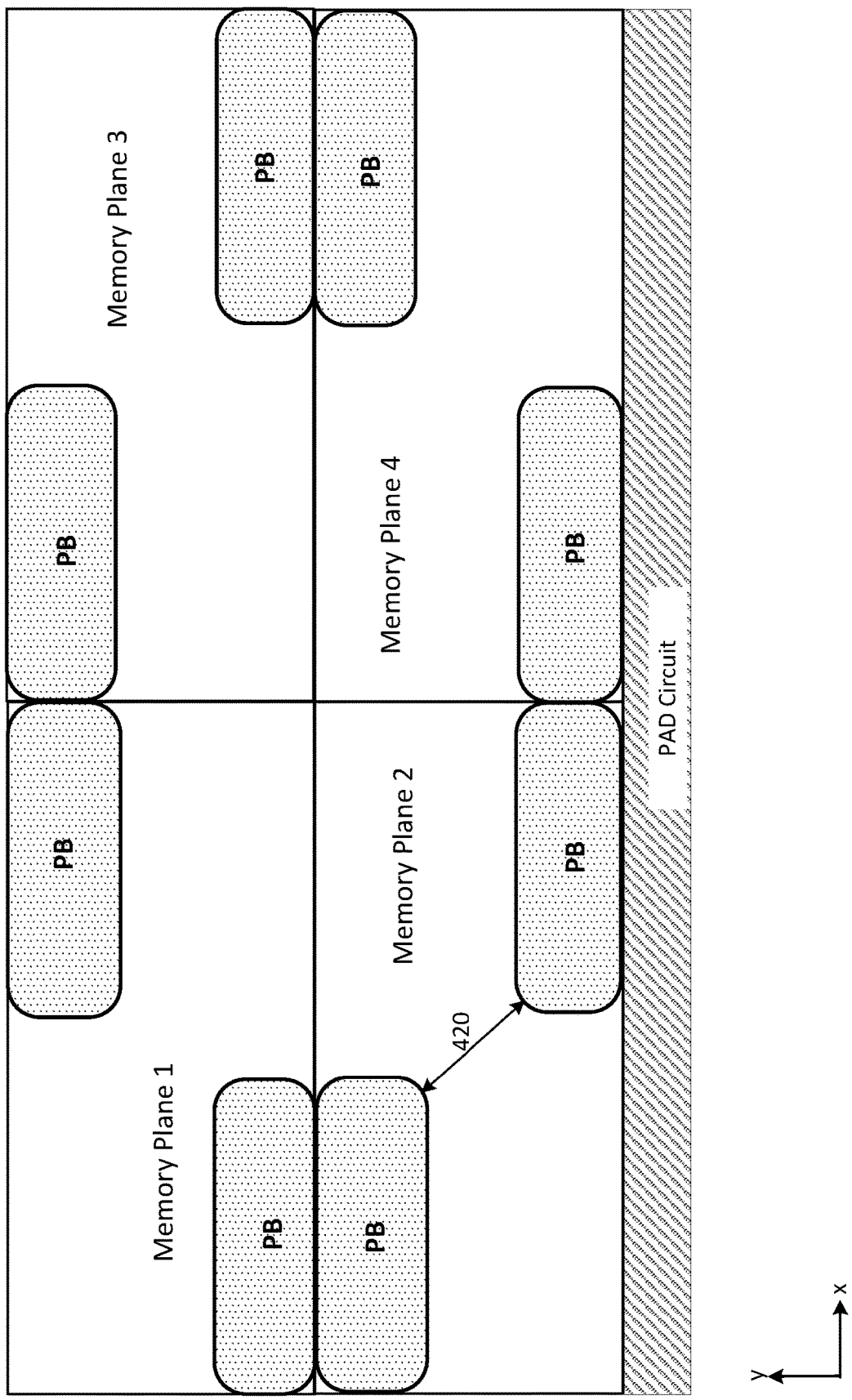
FIG. 4B illustrates a first arrangement of four abutting memory planes of a first semiconductor structure, eight page buffer circuits and a first block of pad circuits, both of a second semiconductor structure, where the first semiconductor structure and the second semiconductor structure are bonded to each other in a face-to-face orientation.

FIG. 4B shows a first illustrative arrangement of four abutting memory planes of a first semiconductor structure, eight page buffer circuits and a first block of pad circuits, both of a second semiconductor structure, where the first semiconductor structure and the second semiconductor structure are bonded to each other in a face-to-face orientation. That is, Memory Plane 1, Memory Plane 2, Memory Plane 3, and Memory Plane 4 are disposed on the first semiconductor structure; and the eight page buffer circuits together with the first block of pad circuits are disposed on the second semiconductor structure. FIG. 4B illustrates the relative spatial positioning of the memory planes, page buffer circuits, and pad circuits after the first semiconductor structure and the second semiconductor structure have been bonded together in a face-to-face orientation. The positions of the page buffer circuits and pad circuits are indicated in these figures by their projections onto the 3D memory array (which itself includes the four memory planes on the first semiconductor structure). In this first arrangement, the projections of the page buffer circuits located in the lower left and upper right of Memory Plane 1; the upper left and lower right of Memory Plane 2; the upper left and lower right of Memory Plane 3; and the lower left and upper right of Memory Plane 4.

As shown in FIG. 4B, Memory Plane 1 of the first semiconductor structure has two page buffer circuits PB of the second semiconductor structure associated therewith, Memory Plane 2 has two page buffer circuits PB associated therewith, Memory Plane 3 has two page buffer circuits PB associated therewith, and Memory Plane 4 has two page buffer circuits PB associated therewith. Each page buffer circuit is positioned such that its projection is within the memory-plane-boundary of its associated memory plane, i.e., Memory Plane 1, Memory Plane 2, Memory Plane 3, or Memory Plane 4. Because each page buffer circuit is coupled to bit lines of its associated memory plane, placing those page buffer circuits so that their projections are within the memory-plane-boundaries is helpful in reducing the length of the connection paths between the page buffer circuits of the second semiconductor structure and the memory plane bit lines of the first semiconductor structure. Also illustrated in FIG. 4B is a first block of pad circuits, which is positioned so that its projection is outside the memory-plane-boundary of any of Memory Plane 1, Memory Plane 2, Memory Plane 3, and Memory Plane 4. In the example of FIG. 4B, the first block of pad circuits is positioned so that its projection is adjacent to Memory Plane 2 and Memory Plane 4. However, this first arrangement does not provide an optimal layout size for the second semiconductor structure. An arrangement that does provide for an improved layout size for the second semiconductor is shown in FIG. 4C.

Figure 4C:
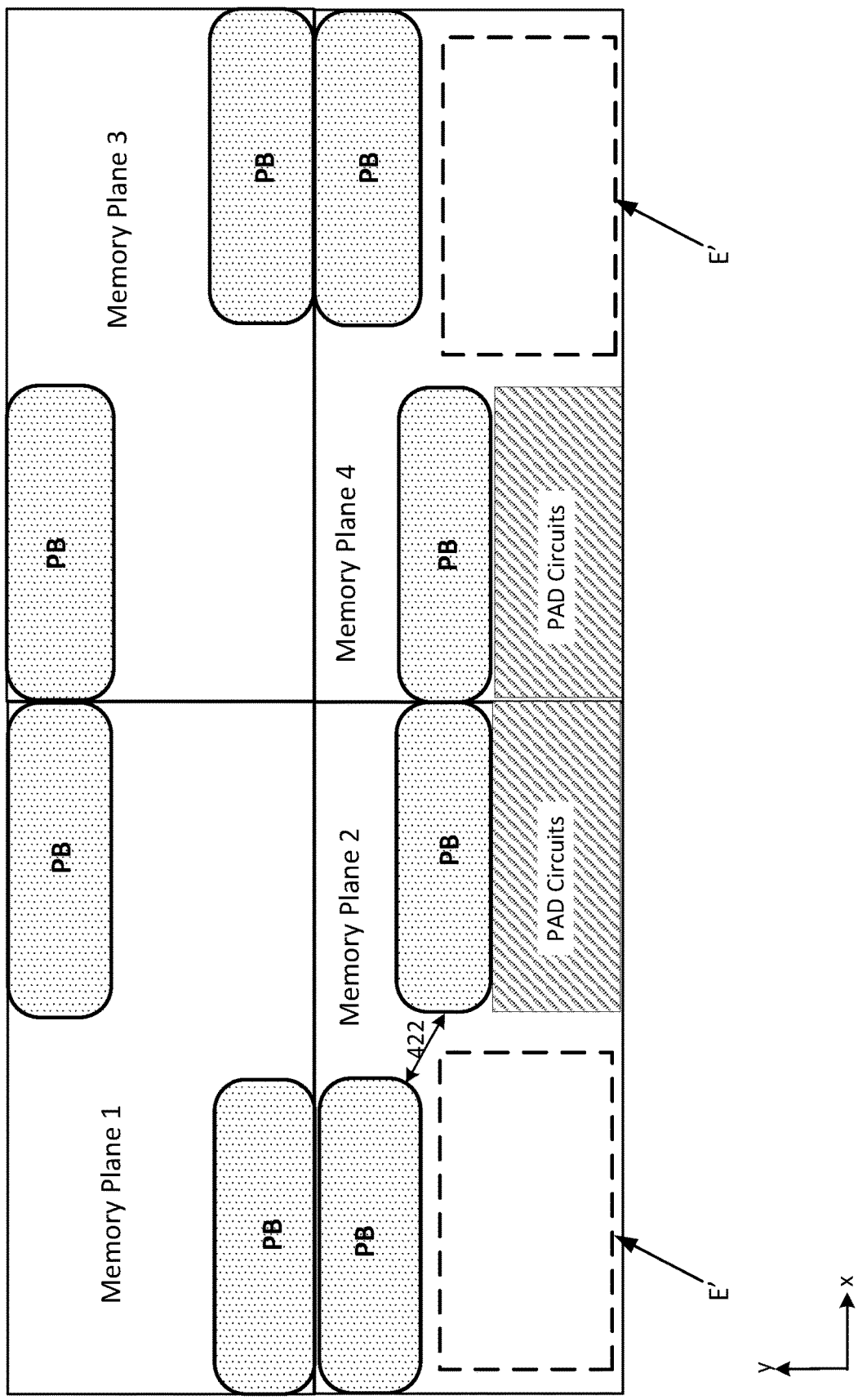
FIG. 4C illustrates a second arrangement of four abutting memory planes of a first semiconductor structure, eight page buffer circuits and a second block of pad circuits, both of a second semiconductor structure, where the first semiconductor structure and the second semiconductor structure are bonded to each other in a face-to-face orientation.

FIG. 4C shows a second illustrative arrangement of four abutting memory planes of a first semiconductor structure, eight page buffer circuits and a second block of pad circuits, both of a second semiconductor structure, where the first semiconductor structure and the second semiconductor structure are bonded to each other in a face-to-face orientation.

The second arrangement of FIG. 4C is similar in several ways to the first arrangement of FIG. 4B. Memory Plane 1 of the first semiconductor structure has two page buffer circuits PB of the second semiconductor structure associated therewith, Memory Plane 2 has two page buffer circuits PB associated therewith, Memory Plane 3 has two page buffer circuits PB associated therewith, and Memory Plane 4 has two page buffer circuits PB associated therewith. Each page buffer circuit is positioned such that its projection onto the 3D memory array is within the memory-plane-boundary of its associated memory plane, i.e., Memory Plane 1, Memory Plane 2, Memory Plane 3, or Memory Plane 4. Because each page buffer circuit is coupled to bit lines of its associated memory plane, placing those page buffer circuits such that their projections onto the 3D memory array are within the memory-plane-boundaries is helpful in reducing the length of the connection paths between the page buffer circuits and the memory plane bit lines.

However, the second arrangement of FIG. 4C is different in several ways from the arrangement of FIG. 4B. In particular, it can be seen that the first block of pad circuits shown in FIG. 4B has been removed and replaced with a second block of pad circuits that is positioned so as to be inside the memory-plane-boundary of Memory Plane 2 and Memory Plane 4. It can further be seen in FIG. 4C, that to make room for positioning the projection of the pad circuits inside the memory-plane-boundary of Memory Plane 2 and Memory Plane 4, one of the page buffer circuits projected in each of Memory Plane 2 and Memory Plane 4, i.e., a total of two page buffer circuits in this example, have been shifted in the y-direction (the bit line direction). However, in this second arrangement, the distance 422 between the first and second page buffer circuits is less than the distance 420 in the first arrangement of FIG. 4B. Because the space between the first and second page buffer circuits is reduced, as compared to the first arrangement, there is less space in which to route signals. The space available for circuits and/or interconnect is shown as dashed line box E'. An arrangement that provides for both an improved layout size for the second semiconductor structure and additional routing space in between the first page buffer circuit and the second page buffer circuit is shown in FIG. 4D.

Figure 4D:
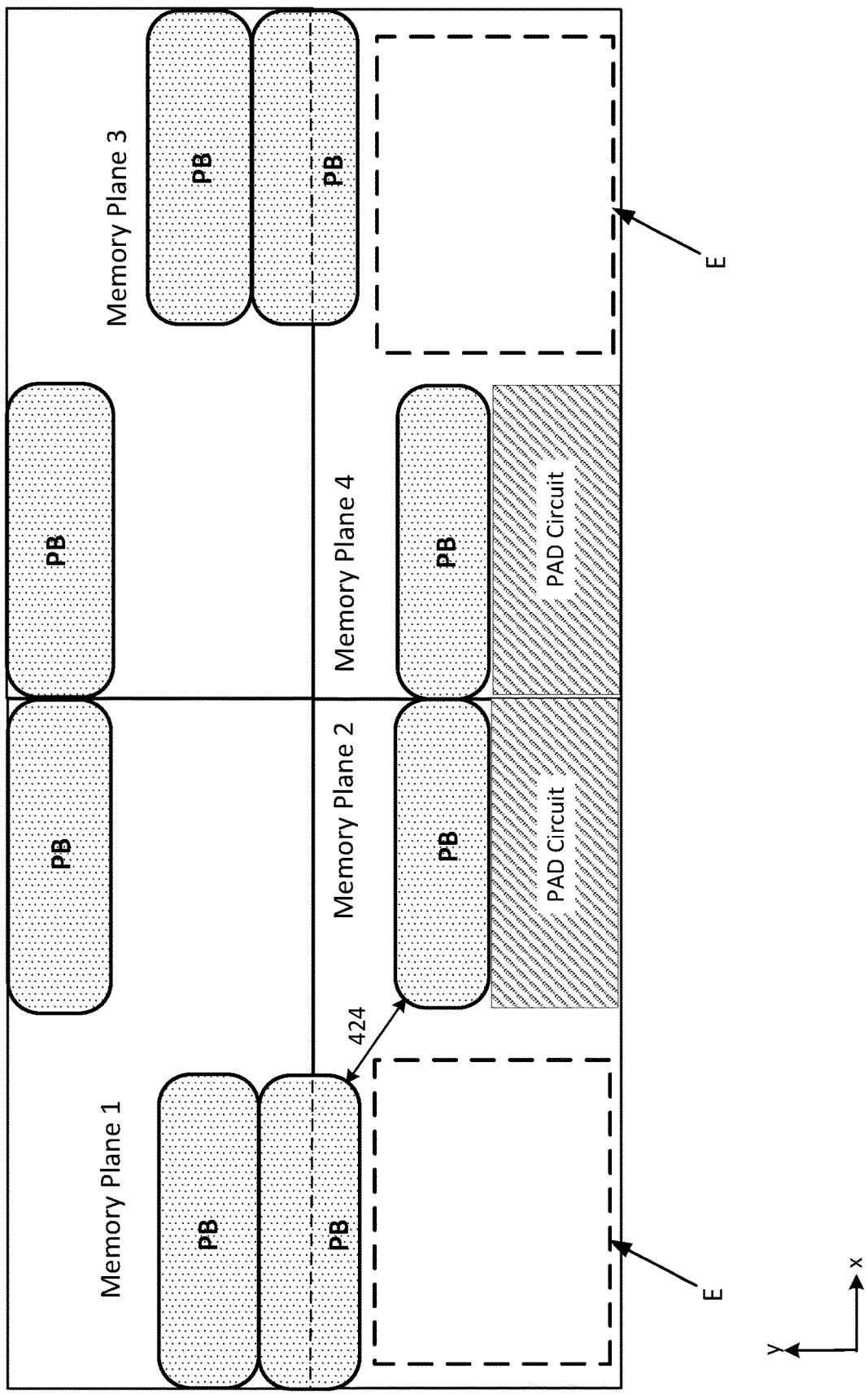
FIG. 4D illustrates a third arrangement of four abutting memory planes of a first semiconductor structure, eight page buffer circuits and a second block of pad circuits, both of a second semiconductor structure, where two of the page buffer circuits cross a memory plane boundary in the bit line direction, and the first semiconductor structure and the second semiconductor structure are bonded to each other in a face-to-face orientation.

FIG. 4D shows a third illustrative arrangement of four abutting memory planes of a first semiconductor structure, eight page buffer circuits and a second block of pad circuits, both of a second semiconductor structure, where each one of two page buffer circuits crosses a corresponding memory plane boundary in the bit line direction, and the first semiconductor structure and the second semiconductor structure are bonded to each other in a face-to-face orientation. The third arrangement of FIG. 4D is different in several ways from the second arrangement of FIG. 4C. In particular, it can be seen that the projection of a first page-buffer-circuit-boundary is shifted in the y-direction, i.e., the bit line direction, as compared to the projection of the first page-buffer-circuit-boundary shown in FIG. 4C. The shifting of the relative positions of the aforementioned projections corresponds to a shift in the actual placement of the first page buffer circuit on the second semiconductor structure. In this way, the distance 424 is increased as compared to the distance 422, thereby providing increased routing space in between the first and second page buffer circuits. Additionally, the space available for circuits and/or interconnect (shown as dashed line box E) is increased as compared to the arrangement of FIG. 4C.

Figure 4E:
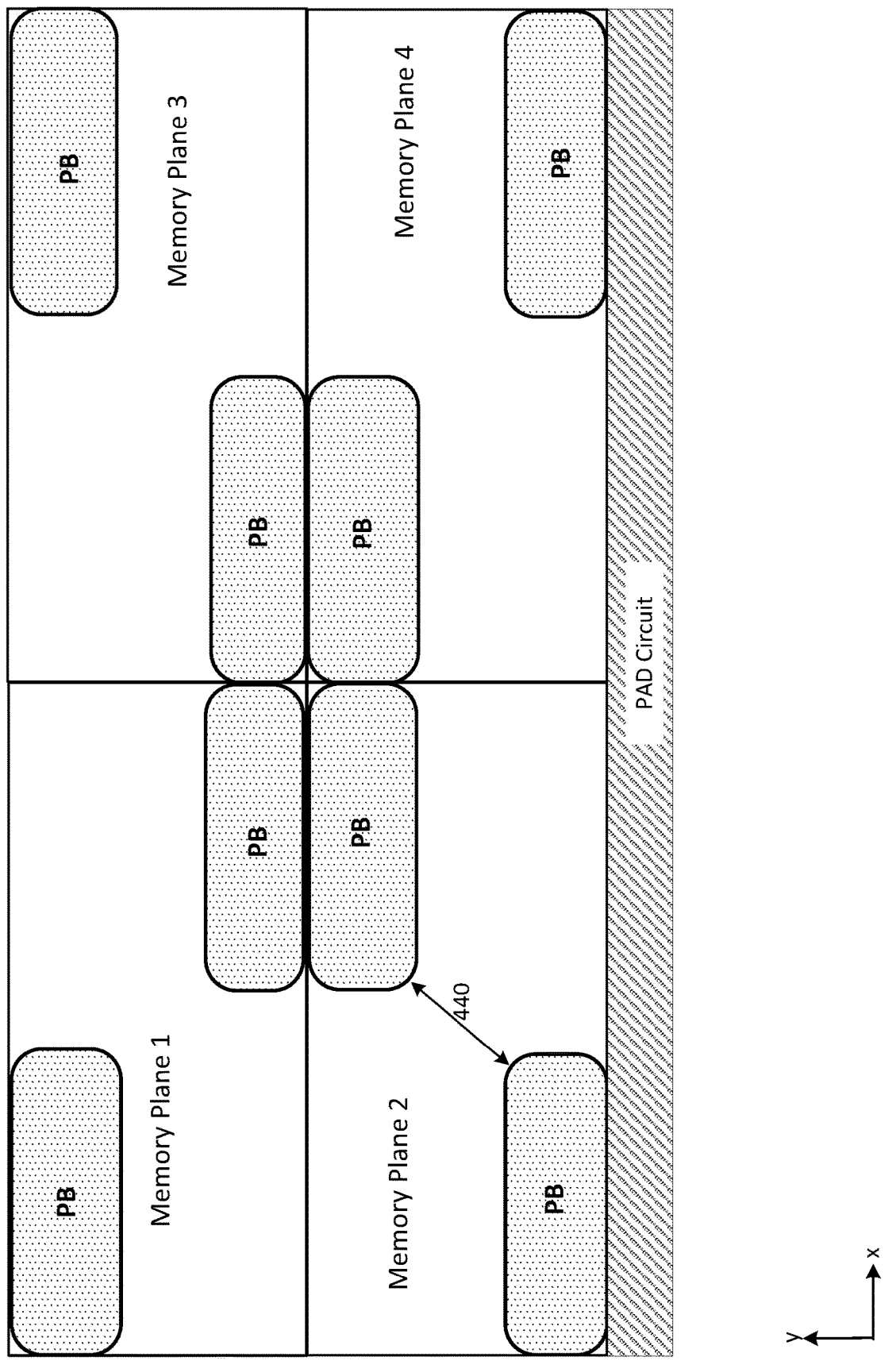
FIG. 4E illustrates a fourth arrangement of four abutting memory planes of a first semiconductor structure, eight page buffer circuits and the first block of pad circuits, both of a second semiconductor structure, where the first semiconductor structure and the second semiconductor structure are bonded to each other in a face-to-face orientation.
Figure 4F:
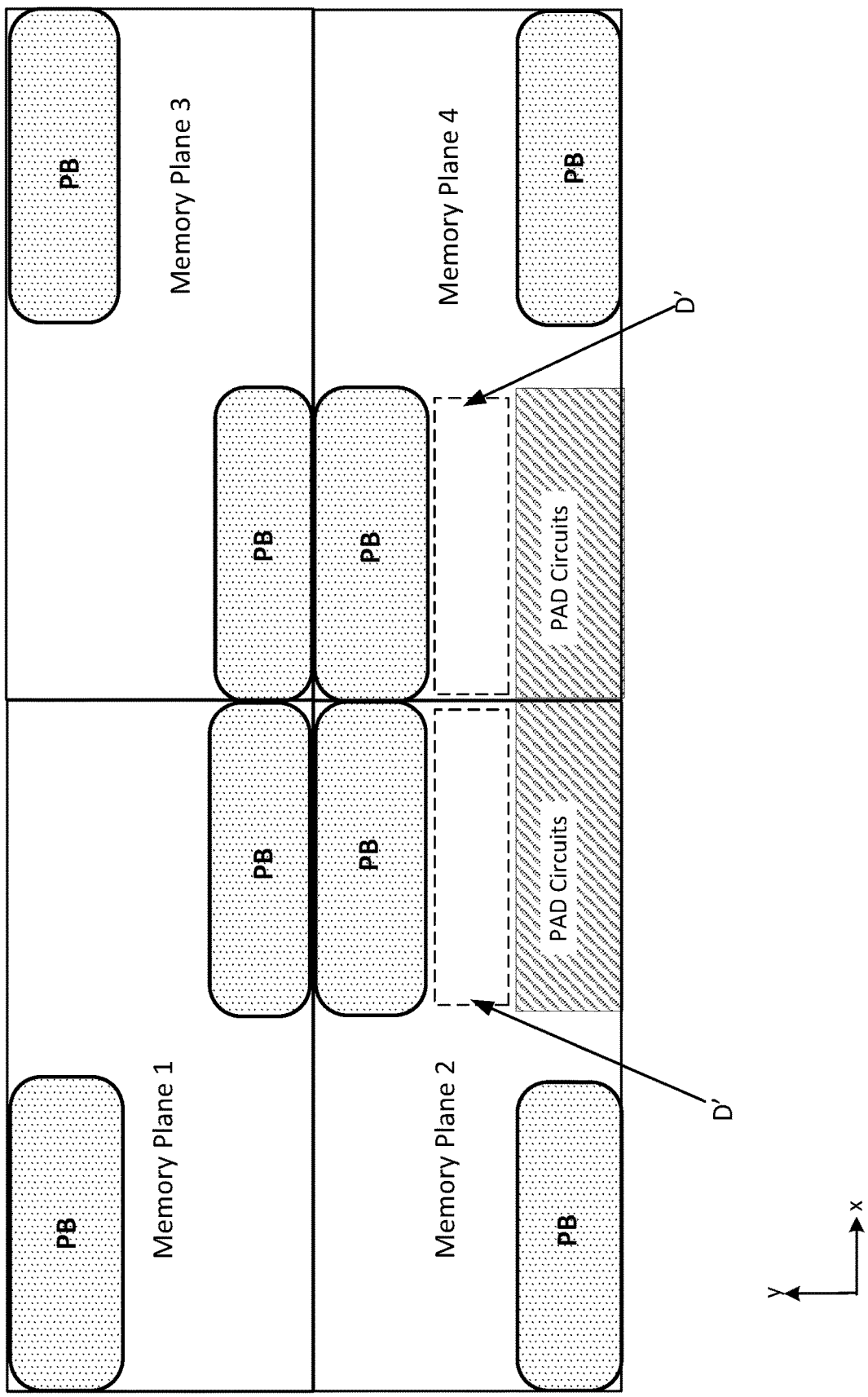
FIG. 4F illustrates a fifth arrangement of four abutting memory planes of a first semiconductor structure, eight page buffer circuits and the second block of pad circuits, both of a second semiconductor structure, where the first semiconductor structure and the second semiconductor structure are bonded to each other in a face-to-face orientation.
Figure 4G:
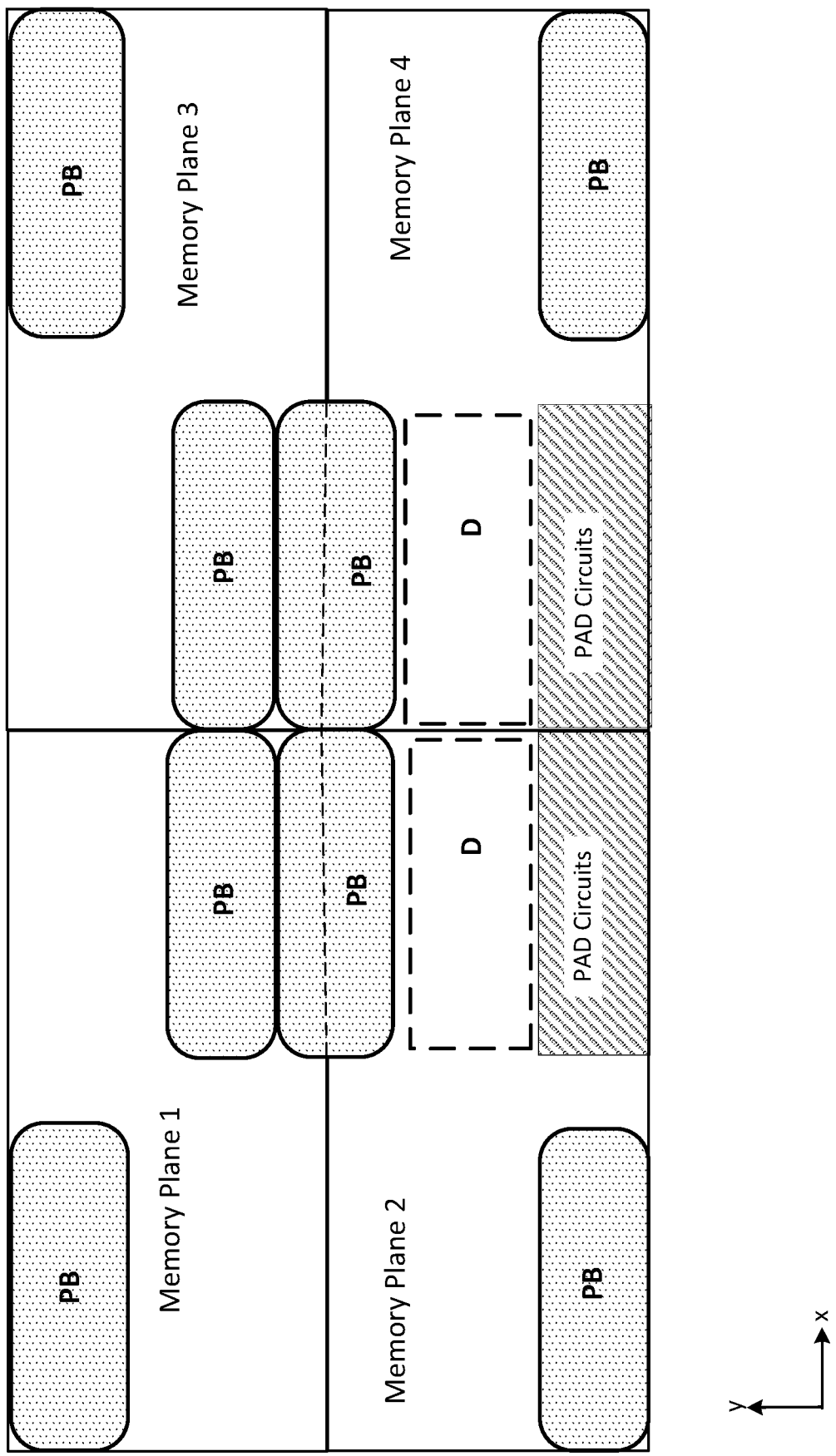
FIG. 4G illustrates a sixth arrangement of four abutting memory planes of a first semiconductor structure, eight page buffer circuits and the second block of pad circuits, both of a second semiconductor structure, where two of the page buffer circuits cross a memory plane boundary in the bit line direction, and the first semiconductor structure and the second semiconductor structure are bonded to each other in a face-to-face orientation.

FIGS. 4E-4G are similar to FIGS. 4B-4D, but illustrate alternative placements of the page buffers relative to the memory planes.

FIG. 4E shows a fourth illustrative arrangement of four abutting memory planes of a first semiconductor structure, eight page buffer circuits and the first block of pad circuits, both of a second semiconductor structure, where the first semiconductor structure and the second semiconductor structure are bonded to each other in a face-to-face orientation. In this fourth arrangement, the positions of the page buffer circuits and pad circuits are indicated by their projections onto the 3D memory array (which itself includes the four memory planes on the first semiconductor structure). In this fourth arrangement, the projections of the page buffer circuits are located in the upper left and lower right of Memory Plane 1; the lower left and upper right of Memory Plane 2; the lower left and upper right of Memory Plane 3; and the upper left and lower right of Memory Plane 4. A distance 440 is indicated between the page buffer circuit projections in Memory Plane 2. The projection of the pad circuits is outside of the memory plane boundaries. This fourth arrangement does not provide an optimal layout size for the second semiconductor structure. An arrangement that does provide for an improved layout size for the second semiconductor is shown in FIG. 4F.

FIG. 4F shows a fifth illustrative arrangement of four abutting memory planes of a first semiconductor structure, eight page buffer circuits and the second block of pad circuits, both of a second semiconductor structure, where the first semiconductor structure and the second semiconductor structure are bonded to each other in a face-to-face orientation. It can be seen that the first block of pad circuits shown in FIG. 4E has been removed and replaced with a second block of pad circuits that is positioned so as to have its projection onto the 3D memory array be inside the memory-plane-boundary of Memory Plane 2 and Memory Plane 4. However, moving the pad circuits in this way means that the space (shown as dashed line box D') available for circuits and/or interconnect between the second block of pad circuits and the page buffer circuits corresponding to the projection in the upper right of Memory Plane 2 and upper left of Memory Plane 4 is now reduced as compared to the fourth arrangement of FIG. 4E. An arrangement that provides for both an improved layout size for the second semiconductor structure and additional space for circuits and/or interconnect between various page buffer circuits and pad circuits is shown in FIG. 4G.

FIG. 4G shows a sixth illustrative arrangement of four abutting memory planes of a first semiconductor structure, eight page buffer circuits and the second block of pad circuits, both of a second semiconductor structure, where two of the page buffer circuits cross a memory plane boundary in the bit line direction, and the first semiconductor structure and the second semiconductor structure are bonded to each other in a face-to-face orientation. The arrangement of FIG. 4G differs from the arrangement FIG. 4F in at least that the page buffer circuit projection in the upper right of Memory Plane 2 has been moved across the memory-plane-boundary of Memory Plane 2 in the bit line direction; and the page buffer circuit projection in the upper left of Memory Plane 4 has been moved across the memory-plane-boundary of Memory Plane 4 in the bit line direction. In this way, the space (shown as dashed line box D) available for circuits and/or interconnect between the second block of pad circuits and the page buffer circuits corresponding to the projection in the upper right of Memory Plane 2 and upper left of Memory Plane 4 is advantageously increased as compared to the arrangement of FIG. 4E.

Figure 5A:
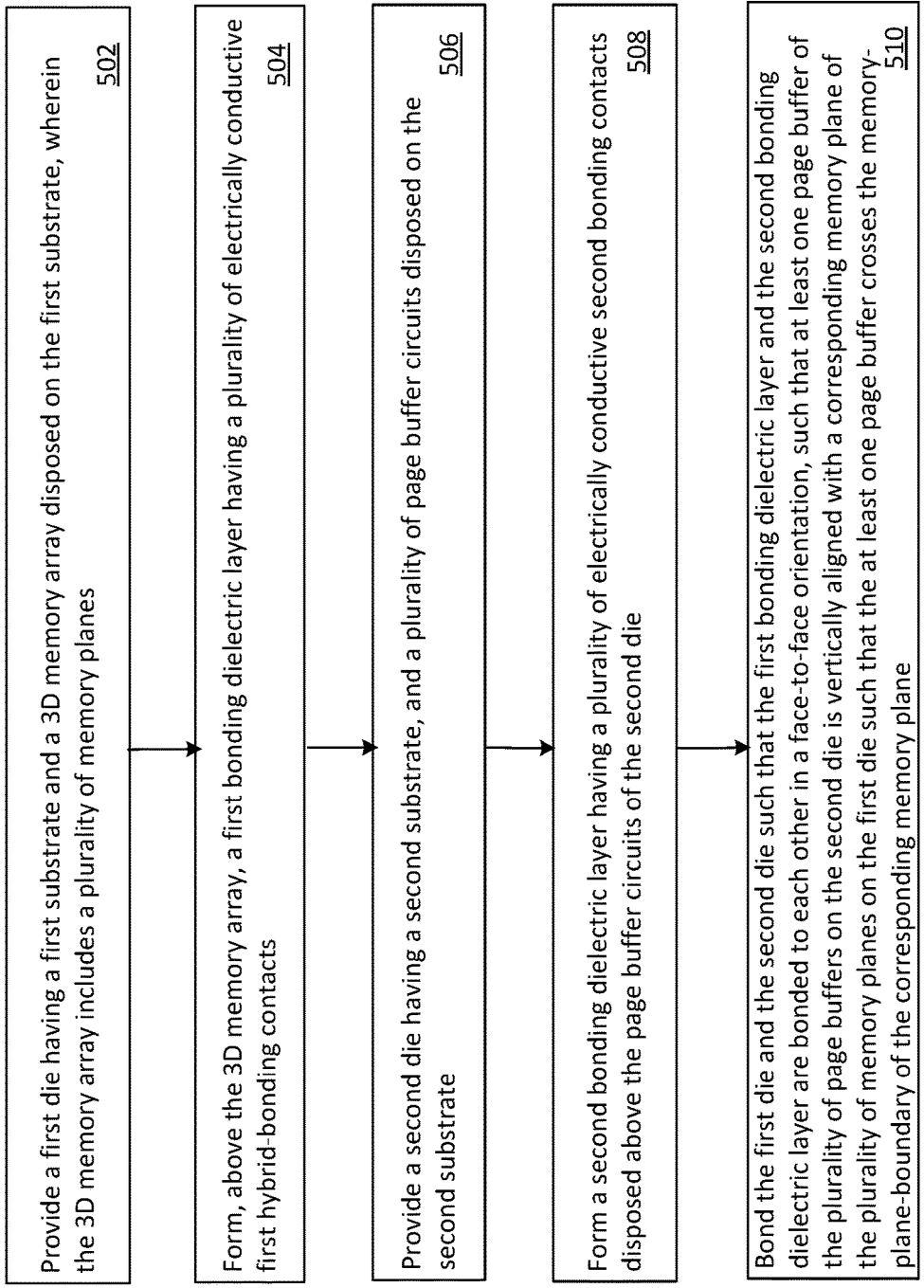
FIG. 5A is a flow diagram of a method of making a 3D memory in accordance with the present disclosure.

FIG. 5A is flow diagram of an illustrative method 500A of making a 3D memory in accordance with the present disclosure. Method 500A includes providing 502 a first die having a first substrate and a 3D memory array disposed on the first substrate, wherein the 3D memory includes a plurality of memory planes, and forming 504, above the 3D memory array, a first bonding dielectric layer, for example, a hybrid-bonding dielectric layer, having a plurality of electrically conductive first bonding contacts disposed therein. In some implementations, one or more layers of interconnect may be disposed above the 3D memory array and below the first bonding dielectric layer. In some implementations, the first bonding contacts include copper. In some implementations, the first substrate may be, but is not limited to, a silicon substrate. The 3D memory array may be, but is not limited to, a NAND flash memory having vertically-oriented NAND strings. The vertically-oriented NAND strings may include flash memory cells such as, for example, charge-trapping memory cells or floating gate memory cells.

Method 500A further includes providing 506 a second die having a second substrate and a plurality of page buffer circuits disposed on the second substrate, and forming 508 a second bonding dielectric layer having a plurality of electrically conductive second bonding contacts disposed above the page buffer circuits of the second die. In some implementations, the page buffer circuits are CMOS circuits. In some implementations, the second substrate may be, but is not limited to, a silicon substrate. In some implementations, the second bonding contacts include copper. In some implementations, one or more layers of interconnect may be disposed above the page buffer circuits and below the second bonding dielectric layer. Method 500A further includes bonding 510 the first die and the second die such that the first bonding dielectric layer and the second bonding dielectric layer are bonded to each other in a face-to-face orientation, such that at least one page buffer of the plurality of page buffers on the second die is vertically aligned with a corresponding memory plane of the plurality of memory planes on the first die such that the at least one page buffer circuit projection crosses the memory-plane-boundary of the corresponding memory plane. In some implementations, the at least one page buffer crosses the memory-plane-boundary in the bit line direction. In some implementations, the bonding of the first die and the second die is hybrid-bonding. In some implementations, after bonding, a first one of the first bonding contacts is in electrical contact with a first one of the second bonding contacts.

Figure 5B:
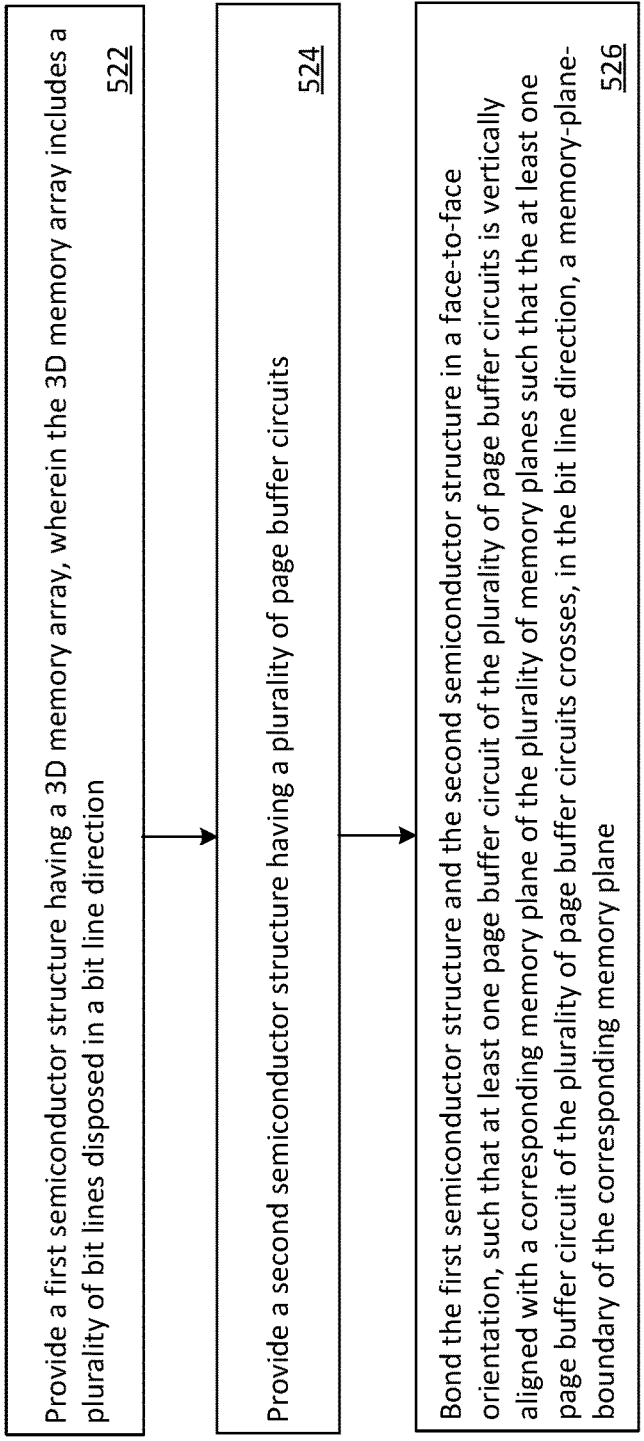
FIG. 5B is a flow diagram of an alternative method of making a 3D memory in accordance with the present disclosure.

FIG. 5B is a flow diagram of an alternative illustrative method 500B of making a 3D memory in accordance with the present disclosure. Method 500B includes providing 522 a first semiconductor structure having a 3D memory array, wherein the 3D memory array includes a plurality of memory planes wherein each memory plane has a plurality of bit lines disposed in a bit line direction, and providing 524 a second semiconductor structure having a plurality of page buffer circuits. In some implementations, the 3D memory array may be, but is not limited to, a NAND flash memory having vertically-oriented NAND strings, and the vertically-oriented NAND strings may include flash memory cells such as, for example, charge-trapping memory cells or floating gate memory cells. In some implementations, the first semiconductor structure includes a first substrate, which may be, but is not limited to, a silicon substrate. In some implementations, the page buffer circuits are CMOS circuits, and the second semiconductor structure includes a substrate. Method 500B further includes bonding 526 the first semiconductor structure and the second semiconductor structure in a face-to-face orientation, such that at least one page buffer circuit of the plurality of page buffer circuits is vertically aligned with a corresponding memory plane of the plurality of memory planes such that the at least one page buffer circuit projection of the plurality of page buffer circuits crosses, in the bit line direction, a memory-plane-boundary of the corresponding memory plane. In some implementations, bonding the first semiconductor structure and the second semiconductor structure together may be achieved by hybrid-bonding.

Figure 6:
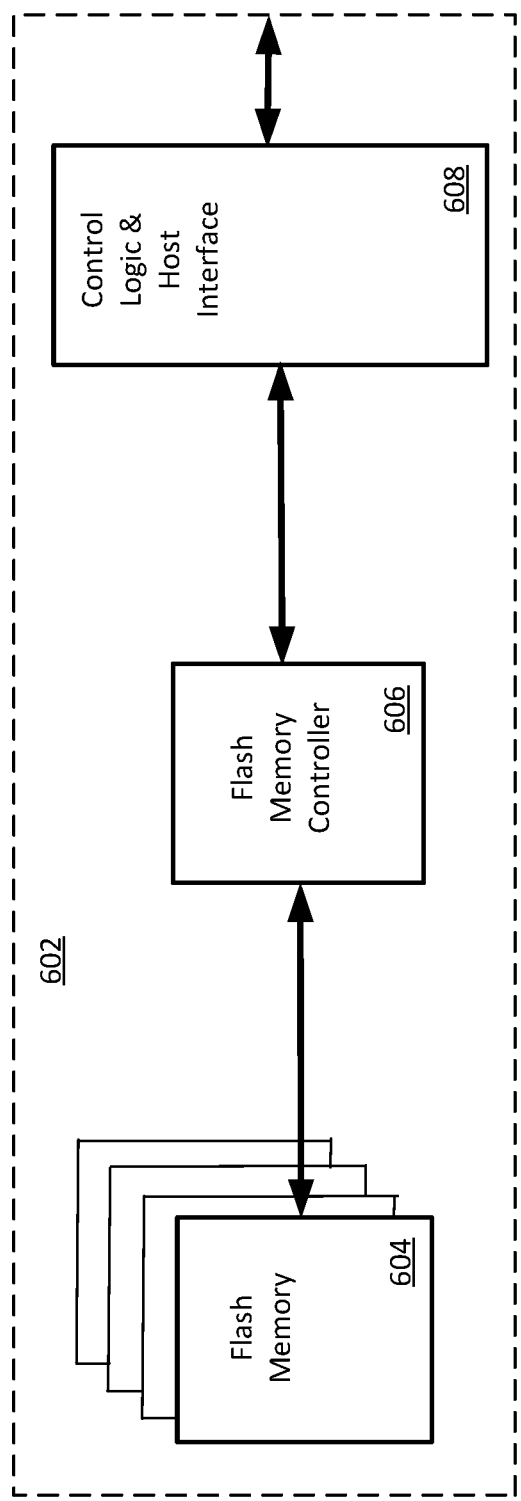
FIG. 6 is a high-level block diagram of a memory system in accordance with the present disclosure.

FIG. 6 is a high-level block diagram of a memory system 600 in accordance with the present disclosure. Various components of memory system 600 may be assembled into a housing 602. The various components of memory system 600 may include, but are not limited to, one or more non-volatile memories such as flash memories 604, a controller such as a flash memory controller 606, and a control logic and host interface block 608. It will be appreciated that control logic and host interface block 608 may alternatively be partitioned into two or more blocks of circuitry. It will be further appreciated that memory system 600 may include a plurality of discrete electrical components such as, but not limited to, resistors, capacitors, and diodes. By way of example and not limitation, resistors may be included to provide termination resistance for impedance matching on high-speed lines. Memory system 600 may be a Universal Flash Storage (UFS) device, a Solid-State Drive (SSD), or a similar non-volatile storage product. That is, memory system 600 can be implemented and packaged into different types of end electronic products.

Still referring to FIG. 6, flash memories 604 may be, but are not limited to, 3D NAND flash memories that contain a plurality of flash memory cells. Flash memory cells may be, for example, charge-trap memory cells, or floating gate memory cells. Flash memories 604 are coupled to flash memory controller 606. Memory controller 606 can be configured to control operations of flash memories 604, such as read, erase, and program operations. Memory controller 606 may also be configured to manage various functions with respect to the data stored, or to be stored, in flash memories 604 including, but not limited to bad-block management, garbage collection, logical-to-physical address conversion, wear leveling, etc. In some implementations, memory controller 606 is further configured to process error correction codes (ECCs) with respect to the data read from or written to flash memories 604. Other suitable functions may be performed by memory controller 606 as well, for example, formatting flash memories 604. Memory controller 606, in combination with control logic and host interface block 608 can communicate with an external device according to a particular communication protocol. For example, memory controller 606 in combination with control logic and host interface block 608 may communicate with an external device through at least one of various interface protocols, such as, but not limited to, a Universal Serial Bus (USB) protocol, a multimedia card (MMC) protocol, a Peripheral Component Interconnect (PCI) protocol, a PCI-express (PCI-E) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, an integrated drive electronics (IDE) protocol, a Firewire protocol, etc.

The foregoing description of the specific implementations will so reveal the general nature of the present disclosure that others can, by applying knowledge within the skill of the art, readily modify and/or adapt for various applications of such specific implementations, without undue experimentation, and without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all implementations of the present disclosure as contemplated by the inventor(s), and thus, are not intended to limit the present disclosure and the subjoined claims in any way.

The breadth and scope of the present disclosure should not be limited by any of the above-described illustrative implementations, but should be defined only in accordance with the subjoined claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A three-dimensional (3D) memory, comprising:
   a first semiconductor structure having a 3D memory array, wherein the 3D memory array includes a plurality of memory planes; and
   a second semiconductor structure having a plurality of page buffer circuits,
   wherein each memory plane has a plurality of bit lines oriented in a bit line direction, a memory-plane-boundary, and a fixed location on the first semiconductor structure,
   wherein each page buffer circuit has a page-buffer-circuit-boundary,
   wherein the first semiconductor structure and the second semiconductor structure are bonded to each other in a face-to-face orientation,
   wherein a projection of a first page-buffer-circuit-boundary, of a first page buffer circuit, onto the 3D memory array partially overlaps a first portion of an area defined by a first memory-plane-boundary and partially overlaps an area defined by a first portion of a second memory-plane-boundary, wherein the first memory-plane-boundary and the second memory-plane-boundary are adjacent in a first direction,
   wherein a projection of a second page-buffer-circuit-boundary, of a second page buffer circuit, onto the 3D memory array overlaps a second portion of the area defined by the first memory-plane-boundary, and wherein the first direction is the bit line direction, and
   wherein the projection of the second page-buffer-circuit-boundary onto the 3D memory array is adjacent in the bit line direction to a projection of a pad circuit onto the 3D memory array.

2. The 3D memory of claim 1, wherein the second semiconductor structure further includes the pad circuit.

3. The 3D memory of claim 1, further comprising:
   a first bonding dielectric layer, having a plurality of electrically conductive first bonding contacts, disposed above the 3D memory array of the first semiconductor structure; and
   a second bonding dielectric layer, having a plurality of electrically conductive second bonding contacts, disposed above the plurality of page buffer circuits of the second semiconductor structure,
   wherein a first memory plane of the plurality of memory planes on the first semiconductor structure is electrically coupled to a first page buffer circuit on the second semiconductor structure through at least one first bonding contact and at least one second bonding contact.

4. The 3D memory of claim 3, wherein the at least one first bonding contact and the at least one second bonding contact each comprise copper.

5. The 3D memory of claim 3, wherein a first bit line of the first memory plane of the plurality of memory planes on the first semiconductor structure is electrically coupled to the first page buffer circuit on the second semiconductor structure through at least one of the plurality of electrically conductive first bonding contacts and at least one of the plurality of electrically conductive second bonding contacts.

6. The 3D memory of claim 1, wherein each memory plane comprises floating gate flash memory cells.

7. The 3D memory of claim 1, wherein each memory plane comprises charge-trapping flash memory cells.

8. The 3D memory of claim 1, further comprising:
   a third page buffer circuit, of the plurality of page buffer circuits, having a third page-buffer-circuit-boundary; and
   a fourth page buffer circuit, of the plurality of page buffer circuits, having a fourth page-buffer-circuit-boundary,
   wherein an area defined by the third page-buffer-circuit-boundary is completely overlapped by an area defined by the second memory-plane boundary, an area defined by the fourth page-buffer-circuit-boundary is completely overlapped by the area defined by the second memory-plane-boundary.

9. A method of making a three-dimensional (3D) memory, comprising:
   providing a first semiconductor structure having a 3D memory array, wherein the 3D memory array includes a plurality of memory planes wherein each memory plane has a plurality of bit lines disposed in a bit line direction;
   forming, above the 3D memory array, one or more interconnect layers;
   forming, above the one or more interconnect layers, a first bonding dielectric layer having a plurality of electrically conductive first bonding contacts;
   providing a second semiconductor structure having a plurality of page buffer circuits; and
   bonding the first semiconductor structure and the second semiconductor structure in a face-to-face orientation, such that at least one page buffer circuit of the plurality of page buffer circuits is vertically aligned with a corresponding memory plane of the plurality of memory planes such that the at least one page buffer circuit projection of the plurality of page buffer circuits crosses, in the bit line direction, a memory-plane-boundary of the corresponding memory plane,
   wherein the one or more interconnect layers provide at least a portion of at least one electrically conductive path between a bit line of the 3D memory array and a first bonding contact of the first bonding dielectric layer.

10. The method of claim 9, further comprising:
    forming, above the plurality of page buffer circuits, one or more interconnect layers; and
    forming a second bonding dielectric layer having a plurality of electrically conductive second bonding contacts disposed above the one or more interconnect layers, wherein the one or more interconnect layers provide at least a portion of at least one electrically conductive path between a first page buffer circuit and a second bonding contact of the second bonding dielectric layer.

11. The method of claim 9, wherein the 3D memory array is a non-volatile memory array.

12. The method of claim 9, wherein the 3D memory array is a flash memory array.

13. The method of claim 9, further comprising:
placing a first page buffer circuit at a location on the second semiconductor structure such that, subsequent to bonding, the first page buffer circuit is vertically aligned with a first memory plane such that a first portion of the first page buffer circuit is non-overlapping with the first memory plane in a bit line direction.

14. A memory system, comprising:
a memory controller device; and
a plurality of non-volatile memory devices coupled to the memory controller device,
wherein at least one of the non-volatile memory devices comprises:
  a first semiconductor structure having a three-dimensional (3D) memory array, wherein the 3D memory array includes a plurality of memory planes; and
  a second semiconductor structure having a plurality of page buffer circuits,
  wherein each memory plane has a plurality of bit lines oriented in a bit line direction, and has a memory-plane-boundary,
  wherein each page buffer circuit has a page-buffer-circuit-boundary,
  wherein the first semiconductor structure and the second semiconductor structure are bonded to each other in a face-to-face orientation,
  wherein a first memory-plane-boundary and a first page-buffer-circuit-boundary are vertically aligned with each other such that the first page-buffer-circuit-boundary is offset from the first memory-plane-boundary in the bit line direction, and such that a first portion of the first page-buffer-circuit-boundary is non-overlapping with an area defined by the first memory-plane-boundary,
  wherein a second page-buffer-circuit-boundary is overlapping the first memory-plane-boundary, and
  wherein the second page-buffer-circuit-boundary is vertically adjacent to a projection of a pad circuit onto the 3D memory array.

15. The memory system of claim 14, wherein a second portion of the first page-buffer-circuit-boundary overlaps with a portion of the area defined by the first memory-plane-boundary.

16. The memory system of claim 15, wherein at least one of the non-volatile memory devices further comprises:
a first bonding dielectric layer, having a plurality of electrically conductive first bonding contacts; and
a second bonding dielectric layer, having a plurality of electrically conductive second bonding contacts.

17. The memory system of claim 16, wherein an electrically conductive path between at least one bit line and at least one page buffer circuit includes a first one of the plurality of electrically conductive first bonding contacts and a first one of the plurality of electrically conductive second bonding contacts.

18. The memory system of claim 14, wherein the first page-buffer-circuit-boundary and the second page-buffer-circuit-boundary are not overlapped.

19. The memory system of claim 14, wherein the second page-buffer-circuit-boundary is adjacent in the bit line direction to the projection of the pad circuit onto the 3D memory array.

20. The memory system of claim 14, wherein the second semiconductor structure further includes the pad circuit.

* * * * *